United States Patent [19]

Katayama

[11] Patent Number: 5,444,278
[45] Date of Patent: Aug. 22, 1995

[54] SEMICONDUCTOR DEVICE AND MANUFACTURING METHOD THEREOF

[75] Inventor: Toshiharu Katayama, Hyogo, Japan

[73] Assignee: Mitsubishi Denki Kabushiki Kaisha, Tokyo, Japan

[21] Appl. No.: 240,283

[22] Filed: May 9, 1994

Related U.S. Application Data

[63] Continuation of Ser. No. 997,755, Dec. 30, 1992, abandoned.

[30] Foreign Application Priority Data

Jan. 18, 1992 [JP] Japan .................................. 4-007001
May 20, 1992 [JP] Japan .................................. 4-127419

[51] Int. Cl.6 .......................................... H01L 31/06
[52] U.S. Cl. .................................................. 257/296
[58] Field of Search ........................ 257/296, 306, 344

[56] References Cited

U.S. PATENT DOCUMENTS

| 5,010,379 | 4/1991 | Ishii . | |
|---|---|---|---|
| 5,045,494 | 9/1991 | Choi et al. . | |
| 5,045,904 | 9/1991 | Kobayashi et al. . | |
| 5,101,251 | 3/1992 | Wakamiya et al. | 257/296 |
| 5,138,412 | 8/1992 | Hioda et al. | 257/296 |

FOREIGN PATENT DOCUMENTS

| 4016268A1 | 6/1991 | Germany . | |
|---|---|---|---|
| 4113733A1 | 10/1991 | Germany . | |
| 4119918A1 | 12/1991 | Germany . | |
| 2-79462A | 9/1963 | Japan . | |
| 1130559 | 5/1989 | Japan | 257/296 |
| 2-69976 | 3/1990 | Japan . | |
| 2-77149 | 3/1990 | Japan . | |
| 2-143456 | 6/1990 | Japan . | |
| 3-297166 | 12/1991 | Japan | 257/296 |
| 3295269 | 12/1991 | Japan | 257/296 |

Primary Examiner—Rolf Hille
Assistant Examiner—Stephen P. Meier
Attorney, Agent, or Firm—Lowe, Price, LeBlanc & Becker

[57] ABSTRACT

A DRAM having a stacked-type capacitor whose structure has a capacitor lower electrode, a first impurity region connected thereto, a third impurity region formed by thermal diffusion of impurities included in the capacitor lower electrode, is disclosed in which an end portion of a third impurity region on the side of gate electrode can be effectively prevented from being extended from an end portion of a first impurity region on the side of gate electrode in the subsequent heat treatment. In the DRAM, an epitaxial silicon layer 8 or a polycrystalline silicon layer 28 having an impurity concentration lower than that of capacitor lower electrode 9 is interposed between capacitor lower electrode 9 and a first impurity region 3b, so that thermal diffusion of impurities in capacitor lower electrode 9 is reduced as compared with the conventional case. As a result, the end portion of the third impurity region which is formed by thermal diffusion on the side of the gate electrode is not extended from the end portion of the first impurity region on the side of the gate electrode, and an effective gate length is not shortened. Hence, a short channel effect and a punch through phenomenon can be effectively prevented.

19 Claims, 27 Drawing Sheets

SEMICONDUCTOR DEVICE AND MANUFACTURING METHOD THEREOF

This application is a continuation of application Ser. No. 07/997,755 filed Dec. 30, 1992 now abandoned.

BACKGROUND OF THE INVENTION

1. Field of the Invention

The present invention relates to semiconductor devices and a manufacturing method thereof and, more particularly, to a structure of a dynamic random access memory (DRAM) and a manufacturing method thereof.

2. Description of the Background Art

Recently, a demand for semiconductor memory devices among semiconductor devices has been rapidly increased, as information processing equipment such as computers has remarkably prevailed. Furthermore, semiconductor memory devices which have a large storage capacity and are capable of a high speed operation are required. Accordingly, technology development relating to high integration density, a high speed response and high reliability of a semiconductor device has been promoted.

Among semiconductor memory devices, a DRAM is known as a memory in which random input/output of stored information is performed. In general, the DRAM is comprised of a memory cell array portion which is a storage region for storing much information and a peripheral circuit portion necessary for external input/output. FIG. 38 is a block diagram showing a general DRAM structure. Referring to FIG. 38, a DRAM 120 includes a memory cell array 121 for storing a data signal of information, a row and column address buffer 122 for externally obtaining an address signal for selecting a memory cell which constitutes a unitary memory circuit, a row decoder 123 and a column decoder 124 for designating a memory cell by decoding the address signal, a sense refresh amplifier 125 amplifying and reading out a signal stored in a designated memory cell, a data in buffer 126 and a data out buffer 127 for data input/output, and a clock generator 128 for generating a clock signal.

Memory cell array 121 occupying a large area on a semiconductor chip has a plurality of memory cells for storing unitary stored information arranged in a matrix. That is, a memory cell is usually comprised of one MOS transistor and one capacitor connected thereto. This memory cell is widely known as a one-transistor-one-capacitor type memory cell. Since the structure of such a memory cell is simple, it is easy to increase integration density of a memory cell array and thus it is widely used for a DRAM with a large capacity.

Memory cells of DRAMs can be divided into several types according to the structures of their capacitors. In a stacked-type-capacitor, which is one of such types, a capacity of the capacitor can be increased by having the main portion of the capacitor extending onto a gate electrode and onto a field isolation film to increase an area where the electrodes of the capacitor face to each other. The stacked-type-capacitor has such a characteristic, so that the capacity of the capacitor can be secured even in a miniaturized semiconductor device with high integration density. Consequently, a stacked-type capacitor has been widely used, as integration density of semiconductor devices has been increased.

FIG. 39 is a sectional view of a DRAM having a conventional stacked-type capacitor. Referring to FIG. 39, a conventional DRAM includes a p type single crystalline silicon substrate 131; an isolation oxide film (a thick silicon oxide film) 132 for isolating elements formed on predetermined regions of a main surface of single crystalline silicon substrate 131; a pair of source/drain regions (n+ impurity implantation layer) 133a, 133b formed in a region surrounded with isolation oxide film 132 to have a channel region 145 interposed with a predetermined space therebetween; a gate electrode 136 formed on channel region 145 with a gate oxide film 135 interposed; an interlayer insulating film 137 formed to cover the whole surface and having contact holes 137a, 137b above n+ impurity implantation layers 133a, 133b; a capacitor lower electrode 138 of low-resistance polycrystalline silicon doped with phosphorus (P) connected to n+ impurity implantation layer 133b and formed to extend on interlayer insulating film 137; a capacitor upper electrode 140 of low-resistance polycrystalline silicon doped with phosphorus (P) formed on capacitor lower electrode 138 with a capacitor dielectric film 139 of $Ta_2O_5$ or the like interposed; an n+ impurity diffusion layer 134 formed through thermal diffusion of impurities (P) of capacitor lower electrode 138; an interlayer insulating film 141 formed to cover the whole surface and having an opening above n+ impurity implantation layer 133a; a polycrystalline silicon film 142a electrically connected to n+ impurity implantation layer 133a and extending on interlayer insulating film 141; a silicide film 142b of $WSi_2$ or the like formed on polycrystalline silicon film 142a; an interlayer insulating film 143 formed on silicide film 142b; and aluminum interconnections 144 formed on interlayer insulating film 143 with a predetermined space therebetween to correspond to gate electrodes 136.

A pair of n+ impurity implantation layers (source/drain regions) 133a, 133b and gate electrode 136 constitute a switching MOS transistor. A stacked-type capacitor is formed of capacitor lower electrode 138, capacitor dielectric film 139 and capacitor upper electrode 140 for storing charges corresponding to a data signal. A bit line 142 is formed of polycrystalline silicon film 142a and silicide film 142b.

FIGS. 40 through 47 are sectional views (the first step through the eighth step) showing a manufacturing process for a conventional DRAM shown in FIG. 39. Referring to FIGS. 39 through 47, a manufacturing process of a conventional DRAM will be described.

Referring to FIG. 40, isolation oxide film (thick silicon oxide film) 132 is formed for isolation in a predetermined region on the main surface of single crystalline silicon substrate 131 using a LOCOS (Local Oxidation of Silicon) method.

Referring to FIG. 41, a gate oxide film layer (not shown) is formed on the whole surface using a thermal oxidation method, and a low-resistance polycrystalline silicon layer (not shown) doped with impurities (P) is deposited on the gate oxide film layer using a CVD (Chemical Vapor Deposition) method. Patterning is then carried out using lithography and dry etching to form gate oxide film 135 and gate electrode 136.

Referring to FIG. 42, a pair of n+ impurity implantation layers (source/drain regions) 133a, 133b are formed in a self aligned manner by ion implantation of arsenic (As) on conditions of 50 KeV, $4 \times 10^{15}/cm^2$ using gate electrode 136 as a mask, as shown in FIG. 42. Thereafter, n+ impurity implantation layers 133a, 133b are electrically activated through a heat treatment.

Referring to FIG. 43, interlayer insulating film 137 is formed on the whole surface using the CVD method.

Referring to FIG. 44, a contact hole 137a is formed in a region on a first impurity region 133b of interlayer insulating film 137 using lithography and dry etching.

Referring to FIG. 45, after the low-resistance polycrystalline silicon layer (not shown) doped with phosphorus (P) is formed on the entire surface using the CVD method, capacitor lower electrode 138 is formed by patterning, using lithography and dry etching. The step of forming capacitor lower electrode 138 by the CVD method is carried out at temperature of about 700° C., so that impurities (phosphorus) in capacitor lower electrode 138 are thermally diffused to single crystalline silicon substrate 131. Thus, n+ impurity diffusion layer 134 is formed. As a result, capacitor lower electrode 138 and n+ impurity implantation layer 133b are electrically connected.

Referring to FIG. 46, capacitor dielectric film 139 is formed on capacitor lower electrode 138. Capacitor dielectric film 139 is formed of a single layered film such as a thermal oxide film, a multi-layered film having a structure of, for example, a silicon oxide film/a silicon nitride film/a silicon oxide film, or $Ta_2O_5$. After a low-resistance polycrystalline silicon film layer (not shown) doped with phosphorus (P) is formed using the CVD method, capacitor upper electrode 140 is formed by patterning, using lithography and dry etching. Interlayer insulating film 141 is formed on the whole surface using the CVD method. For flattening of the upper surface of interlayer insulating film 141, a heat treatment is carried out at temperature of about 850° C. by a reflow method.

Referring to FIG. 47, contact holes 137a and 141a are formed in a region located on n+ impurity implantation layer 133a in interlayer insulating films 137 and 141 using lithography and dry etching, so that a part of n+ impurity implantation layer 133a is exposed. Polycrystalline silicon film 142a doped with impurities is formed to electrically connect with the exposed n+ impurity implantation layer 133a and extend on interlayer insulating film 141. A silicide film 142b of $WSi_2$ or the like is formed using a sputtering method on polycrystalline silicon film 142a. Interlayer insulating film 143 is formed on the whole surface using the CVD method. For flattening of the surface of interlayer insulating film 143, a heat treatment at temperatures of about 850° C. is carried out by a reflow method.

Finally, as shown in FIG. 39, aluminum interconnections 144 are formed with predetermined spaces therebetween.

As described above, a conventional DRAM has been formed.

In a memory cell forming a conventional DRAM, as described above, impurities (phosphorus) in capacitor lower electrode 138 is thermally diffused toward silicon single crystalline substrate 131, so that n+ impurity diffusion layer 134 is formed to electrically connect n+ impurity implantation layer 133b and capacitor lower electrode 138. That is, through thermal diffusion by heat at about 700° C. in forming capacitor lower electrode 138, n+ impurity diffusion layer 134 is formed.

However, as shown in FIG. 46, after interlayer insulating film 141 is formed, heat at about 850° C. is applied in the reflow method for flattening of the surface. Consequently, impurities (phosphorus) in capacitor lower electrode 138 are further diffused towards single crystalline silicon substrate 131. As a result, the diffusion region of n+ impurity diffusion layer 134 is further enlarged, resulting in a disadvantage that an end portion B of n+ impurity diffusion layer 134 extends from an end portion A of n+ impurity implantation layer 133b on the side of gate electrode 136. Furthermore, as shown in FIG. 47, interlayer insulating film 143 is also subjected to a heat treatment at about 850° C. in the reflow method for flattening so that impurities (phosphorus) in capacitor lower electrode 138 are further diffused towards single crystalline silicon substrate 131 and thus n+ impurity diffusion layer 134 is further diffused to the side of the gate electrode.

When a region of n+ impurity diffusion layer 134 on the side of gate electrode 136 protrudes from n+ impurity implantation layer 133b and extends under gate electrode 136, the following problems may arise.

An effective gate length $L_0$ of gate electrode 136 is shortened by the extended area of n+ impurity diffusion layer 134 from n+ impurity implantation layer 133b. That is, the effective gate length becomes $L_l$. As a result, a so-called short channel effect is produced in which a threshold voltage of a switching MOS transistor is decreased. When the channel length is short, a depletion layer in the vicinity of n+ impurity implantation layer 133a which is to be a drain region in data writing extends to n+ impurity diffusion layer 134 which is to be a source region, and therefore, a problem may arise that a so-called punch through phenomenon tends to occur in which current can not be controlled by a gate voltage. In addition, n+ impurity diffusion layer 134 is not formed in a self aligned manner as n+ impurity implantation layer 133b, so that the extended area of n+ impurity diffusion layer 134 from n+ impurity implantation layer 133b varies depending on variation of alignment of gate electrode 136 and capacitor lower electrode 138 in patterning. As a result, a problem arises that transistor characteristics such as a threshold voltage vary.

FIG. 48 is a sectional view of structure of a DRAM having another conventional stacked-type capacitor. With reference to FIG. 48, this conventional DRAM includes a P type single crystalline silicon substrate 241 having a trench 241a formed in a predetermined region on a main surface thereof, an isolation oxide film 242 for elementary isolation which is formed on the main surface of single crystalline silicon substrate 241 and is adjacent to trench 241a, an n+ impurity implantation layer 243b having its end portion formed to be in contact with a sidewall of trench 241a, an n+ impurity implantation layer 243a formed to interpose a channel region 257 between n+ impurity implantation layers 243a and 243b with a predetermined space from each other, an n+ impurity implantation layer 244 formed along a surface of trench 241a, a gate electrode 247 formed on channel region 257 with a gate oxide film 246 interposed therebetween, an interlayer insulating film 248 having contact holes 248a and 248b, respectively, above n+ impurity implantation layer 243a and a recessed portion 241a, a capacitor lower electrode 250 made of a lower resistance polycrystalline silicon film including a large amount of impurities (phosphorus (P) of $4-8\times10^{20}/cm^3$) formed to extend on a surface of interlayer insulating film 248, and formed on n+ impurity implantation layer 244 located at a bottom and a sidewall of recessed portion 241a, a capacitor dielectric film 251 formed on capacitor lower electrode 250, a capacitor upper electrode 252 formed on capacitor dielectric film 251, an n+ impurity diffusion layer 245 formed by thermal diffusion of impurities in capacitor lower electrode 250, an interlayer insulating film 253 formed to cover the whole surface and having a contact hole 253a above n+ impurity implantation layer 243a, a polycrystalline silicon film 254a electrically connected with n+ impurity implantation layer 243a in contact holes 248a, 253a, and formed along the surface of interlayer insulating film 253, a silicide film 254b formed on polycrystalline silicon film 254a, an interlayer insulating film 255 formed on silicide film 254b, and aluminum interconnections 256 formed with predetermined spaces from each other on interlayer insulating film 255. The conventional DRAM of another type having such a structure also has similar problems to those of the conventional DRAM shown in FIG. 39. That is, for flattening of the surfaces of interlayer insulating films 253 and 255, a heat treatment at about 850° C. is carried out by a reflow method. This heat treatment causes impurities (phosphorus) within capacitor lower electrode 250 to thermally diffuse toward single crystalline silicon substrate 241. As a result, a diffusion area of n+ impurity diffusion layer 245 further extends, resulting in a disadvantage that an end portion B of n+ impurity diffusion layer 245 extends from an end portion A of n+ impurity implantation layer 243b on the side of gate electrode 247 to its lower part. This results in occurrence of a short channel effect and liability of a punch through phenomenon.

SUMMARY OF THE INVENTION

One object of the present invention is to effectively prevent shortening of an effective gate length in a semiconductor device.

Another object of the present invention is to effectively prevent transistor characteristics from varying in a semiconductor device.

Yet another object of the present invention is to effectively reduce diffusion of impurities included in a capacitor lower electrode in a semiconductor substrate in a succeeding heat treatment step of a manufacturing method of a semiconductor device.

Still another object of the present invention is to effectively prevent shortening of an effective channel length even when impurities of a capacitor lower electrode are further diffused in the succeeding heat treatment step.

In one aspect of the present invention, a semiconductor device includes a semiconductor substrate of a first conductivity type having a main surface; first and second impurity regions of a second conductivity type formed spaced apart on the main surface of the semiconductor substrate on opposite sides of a channel region interposed therebetween; a third impurity region of the second conductivity type formed in the first impurity region; a gate electrode formed on the channel region with a gate insulating film interposed; a first conductive layer formed on the first and third impurity regions and including predetermined impurities; and a second conductive layer formed on the first conductive layer and including predetermined impurities. An impurity concentration of the first conductive layer is lower than that of the second conductive layer.

In operation, since the first conductive layer having the impurity concentration lower than that of the second conductive layer is interposed between a first impurity region and a second conductive layer, diffusion of impurities in the second conductive layer toward the semiconductor substrate in a heat treatment step is reduced in comparison with the conventional case. As a result, further diffusion of impurities in the second conductive layer into the semiconductor substrate in the succeeding heat treatment step is also effectively reduced, and extension of an end portion of a third impurity region on the side of a gate electrode from an end portion of a first impurity region on the side of the gate electrode formed by diffusion is effectively prevented. When variation of alignment of the gate electrode and the second conductive layer occurs in patterning, extension of the side portion of the third impurity region on the gate electrode side from the end portion of the first impurity region on the gate electrode is effectively prevented.

In another aspect of the present invention, a semiconductor device includes a semiconductor substrate of a first conductivity type having a main surface and having a recessed portion in a predetermined region on the main surface; a first impurity region of a second conductivity type formed in a predetermined region on the main surface of the semiconductor substrate; a second impurity region of the second conductivity type formed along a surface of the recessed portion of the semiconductor substrate and spaced apart from the first impurity region to have a channel region interposed therebetween; a third impurity region of the second conductivity type formed on a bottom surface of the recessed portion of the semiconductor substrate to overlap the second impurity region; a gate electrode formed on the channel region with a gate insulating film interposed; a sidewall insulating film formed on the second impurity region located on a sidewall of the recessed portion; and a conductive layer connected to the second impurity region at the bottom portion of the recessed portion and extending along the sidewall insulating film.

The second impurity region is formed along the surface of the recessed portion of the semiconductor substrate, and the sidewall insulating film is formed on the second impurity region on the sidewall of the recessed portion, and a conductive layer is formed to be connected to the second impurity region at the bottom portion of the recessed portion and extend along the sidewall insulating film. Consequently, in operation, even if the impurities in the conductive layer are diffused in the semiconductor substrate through a heat treatment for the conductive layer, an impurity region formed by the heat treatment is effectively prevented from overlapping the channel region between the first impurity region and the second impurity region. In addition, even when variation of alignment of the conductive layer and the gate electrode occurs, the impurity region can be effectively prevented from overlapping the channel region.

In still another aspect of the present invention, a semiconductor device includes: a semiconductor substrate of a first conductivity type having a main surface and having a recessed portion in a predetermined region on the main surface; a first impurity region of a second conductivity type formed in a predetermined region on the main surface of the semiconductor substrate; a second impurity region of the second conductivity type formed along a surface of the recessed portion of the semiconductor substrate to interpose a channel region between the first and second impurity regions with a predetermined space from each other; a third impurity region of the second conductivity type formed to overlap the second impurity region at a bottom surface of the recessed portion of the semiconductor substrate; a gate electrode formed on the channel region with a gate insulating film interposed therebetween; a sidewall diffusion moderating film formed on the second impurity region located at the sidewall of the recessed portion; and a conductive layer including a predetermined amount of impurities, connected with the second and third impurity regions located at the bottom of the recessed portion and formed to extend along the sidewall diffusion moderating film.

In operation, the second impurity region is formed along the surface of the recessed portion of the semiconductor substrate, the sidewall diffusion moderating film is formed on the second impurity region located at the sidewall of the recessed portion, and the conductive layer is formed to be connected with the second and third impurity regions located at the bottom of the recessed portion and extending along the sidewall diffusion moderating film. Accordingly, even if impurities within the conductive layer are diffused into the semiconductor substrate by a heat treatment of the conductive layer, the third impurity region formed by the thermal diffusion is effectively prevented from overlapping the channel region located between the first and second impurity regions. In addition, even if there are variations of alignment in patterning of the conductive layer and the gate electrode, overlapping of the third impurity region and the channel region is effectively prevented.

In yet another aspect of the present invention, a manufacturing method of a semiconductor device includes the steps of forming a gate electrode on a main surface of a semiconductor substrate of a first conductivity type with a gate insulating film interposed; forming first and second impurity regions of a second conductivity type by introduction of impurities; forming an insulating layer to have an opening on the first impurity region; forming a first conductive layer on the first impurity region in the opening; forming a second conductive layer having an impurity concentration higher than that of the first conductive layer on the first conductive layer; and forming a third impurity region of the second conductivity type through thermal diffusion of the impurities in the capacitor lower electrode toward the semiconductor substrate through the first conductive layer.

In operation, the first conductive layer including the impurities is formed on the first impurity region, the second conductive layer containing more impurities than the conductive layer is formed on the first conductive layer, and the third impurity region is formed through thermal diffusion of the impurities in the second conductive layer toward the semiconductor substrate through the first conductive layer. The amount of the impurities diffused from the second conductive layer toward the semiconductor substrate is decreased, because of the first conductive layer, compared to the conventional case, so that the amount of impurities in the second conductive layer further diffused into the semiconductor substrate is also effectively reduced, and the end portion of the third impurity region on the gate electrode side is prevented from being extended from the end portion of the first impurity region on the gate electrode side toward the gate electrode side, therefore variation in transistor characteristics can be also prevented.

In still another aspect of the present invention, a manufacturing method of a semiconductor device includes the steps of forming a gate electrode on a main surface of a semiconductor substrate of a first conductivity type with a gate insulating film interposed; forming a first impurity region of a second conductivity type through introduction of impurities; forming a recessed portion on the main surface of the semiconductor substrate with a predetermined space from the first impurity region; forming a second impurity region of the second conductivity type along a main surface of the recessed portion; forming a sidewall insulating film on a sidewall portion of the recessed portion; forming a conductive layer electrically connected to the bottom portion of the recessed portion and extending along the sidewall insulating film.

In operation, the recessed portion is formed on the main surface of the semiconductor substrate, the second impurity region is formed along the main surface of the recessed portion, the sidewall insulting film is formed on the sidewall portion of the recessed portion, and the conductive layer electrically connected to the bottom portion of the recessed portion and including impurities is formed to extend along the sidewall insulating film. Consequently, even when the impurities of the conductive layer are further diffused in the succeeding heat treatment, the impurity region formed by diffusion can be prevented from overlapping the channel region between the first impurity region and the second impurity region. And also, even when variation of alignment of the gate electrode and the conductive layer occurs in patterning, the impurity region formed by the diffusion is prevented from overlapping the channel region and therefore variation in transistor characteristics is also prevented.

In still another aspect of the present invention, a manufacturing method of a semiconductor device includes the steps of: forming a gate electrode on a main surface of a semiconductor substrate of a first conductivity type with a gate insulating film interposed therebetween; forming a first impurity region of a second conductivity type by introduction of impurities; forming a recessed portion on the main surface of the semiconductor substrate with a predetermined space from the first impurity region; forming a second impurity region of the second conductivity type along a main surface of the recessed portion; forming a sidewall diffusion moderating film on a sidewall of the recessed portion; forming a conductive layer including a predetermined amount of impurities, electrically connected to a bottom of the recessed portion and extending along the sidewall diffusion moderating film; and forming a third impurity region of the second conductivity type by thermal diffusion of impurities in the conductive layer to the bottom of the recessed portion.

In operation, the recessed portion is formed on the main surface of the semiconductor substrate, the second impurity region is formed along the main surface of the recessed portion, the sidewall diffusion moderating film is formed at the sidewall of the recessed portion, the conductive layer including impurities and electrically connected to the bottom of the recessed portion is formed to extend along the sidewall diffusion moderating film, and the third impurity region is formed by thermal diffusion of the impurities in the conductive layer to the bottom of the recessed portion. Accordingly, even if the impurities in the conductive layer are further diffused by a succeeding heat treatment step, the third impurity region to be formed by the diffusion is effectively prevented from overlapping the channel region located between the first and second impurity regions. In addition, even if there are variations of alignment in patterning of the gate electrode and the conductive layer, the third impurity region to be formed by the diffusion is prevented from overlapping the channel region, thereby avoiding variations in transistor characteristics.

The foregoing and other objects, features, aspects and advantages of the present invention will become more apparent from the following detailed description of the present invention when taken in conjunction with accompanying drawings.

DESCRIPTION OF THE PREFERRED EMBODIMENTS

Embodiments according to the present invention will be described with reference to the figures hereinafter.

Figure 1:
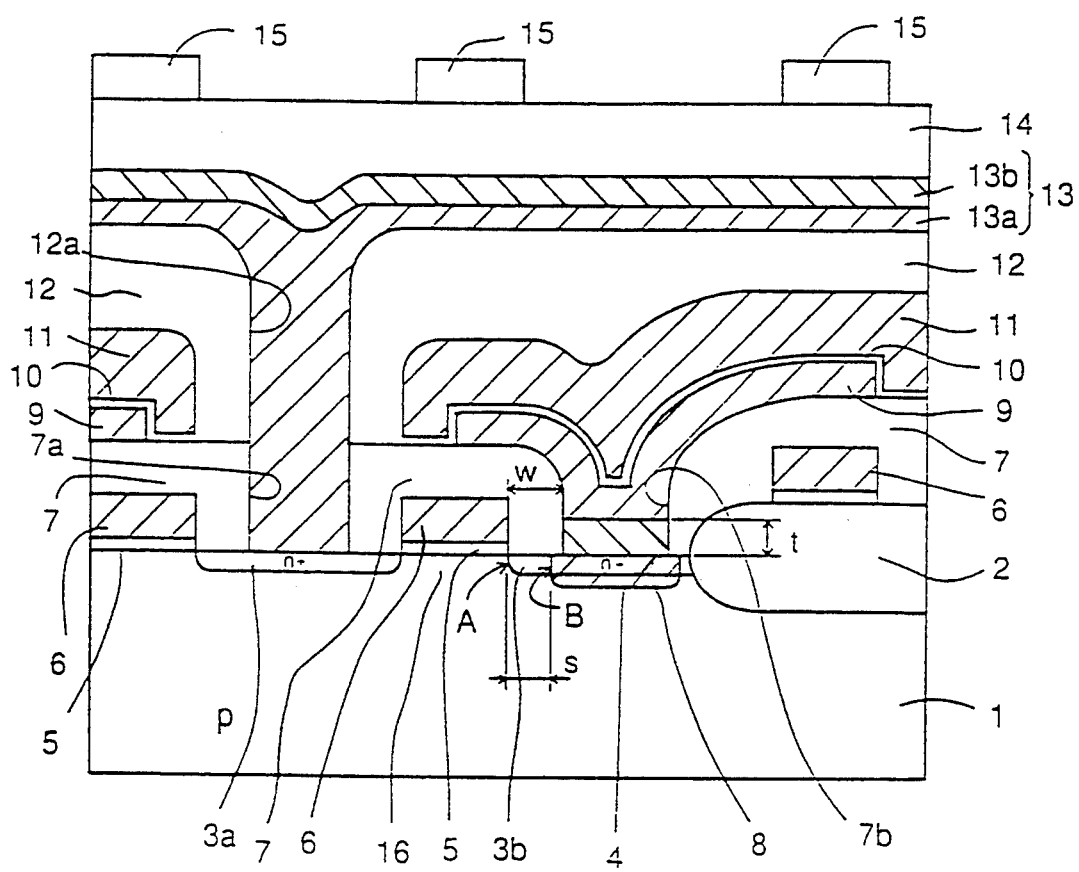
FIG. 1 ms a sectional view showing a DRAM having a stacked-type capacitor according to one embodiment of the present invention.

Referring to FIG. 1, a DRAM of the embodiment includes a P type single crystalline silicon substrate 1; an isolation oxide film (a thick silicon oxide film) 2 for isolation of elements formed on a main surface of single crystalline silicon substrate 1 with a predetermined space therebetween; a pair of n+ impurity implantation layers (source/drain regions) 3a, 3b formed in a region surrounded with isolation oxide film 2 to have channel region 16 interposed with a predetermined space therebetween; gate electrode 6 formed on channel region 16 through gate oxide film 5; an interlayer insulating film 7 formed to cover the whole surface and having contact holes 7a, 7b on n+ impurity implantation layers 3a, 3b, respectively; an epitaxial silicon layer 8 formed to connect with n+ impurity implantation layer 3b in contact hole 7b; a capacitor lower electrode 9 of a low-resistance polycrystalline silicon film doped with phosphorus (P), having an impurity concentration higher than that of epitaxial silicon layer 8 and formed on epitaxial silicon layer 8; a capacitor dielectric film 10 of a single layered film of a thermal oxide film or the like, a multi-layered film of, for example, a silicon oxide film/a silicon nitride film/a silicon oxide film, or $Ta_2O_5$ and the like formed on capacitor lower electrode 9; a capacitor upper electrode 11 of a low-resistance polycrystalline silicon doped with phosphorus (P) formed on capacitor dielectric film 10; an n+ impurity diffusion layer 4 formed by thermal diffusion of the impurities (phosphorus) in capacitor lower electrode 9 toward single crystalline silicon substrate 1 and for electrically connecting n+ impurity implantation layer 3b and capacitor lower electrode 9; an interlayer insulating film 12 formed to cover the whole surface and having a contact hole 12a above n+ impurity implantation layer 3a; a polycrystalline silicon film 13a connecting with n+ impurity implantation layer 3a in contact holes 7a, 12a and formed to extend on interlayer insulating film 12; a silicide film 13b of $WSi_2$ formed on polycrystalline silicon film 13a; an interlayer insulating film 14 formed on silicide film 13b; and aluminum interconnections 15 formed on interlayer insulating film 14 with a predetermined spaces therebetween.

A switching MOS transistor is formed of a pair of n+ impurity implantation layer (source/drain regions) 3a, 3b, and gate electrode 6. A bit line 13 for transmitting a data signal is formed of a polycrystalline silicon film 13a and a silicide film 13b. A stacked-type capacitor is formed of capacitor lower electrode 9, capacitor dielectric film 10 and capacitor upper electrode 11 for storing charges corresponding to the data signal.

In the embodiment, epitaxial silicon layer 8 having an impurity concentration lower than that of capacitor lower electrode 9 is interposed between n+ impurity implantation layer 3b and capacitor lower electrode 9, as described above, so that the amount of impurities (phosphorus) in capacitor lower electrode 9 diffused toward single crystalline silicon substrate 1 is decreased compared to the conventional case.

Figure 2:
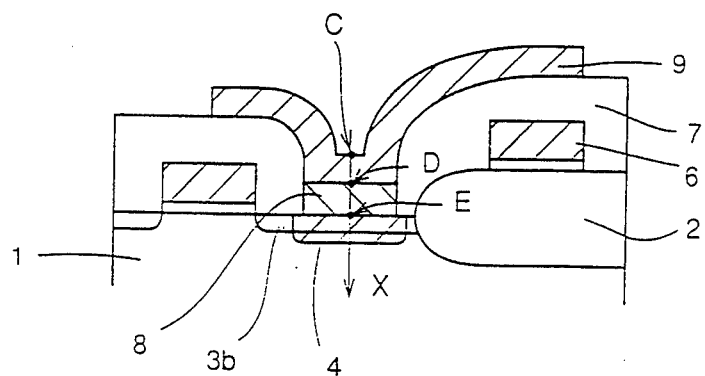
FIG. 2 is an enlarged sectional view of a contact portion of a capacitor lower electrode shown in FIG. 1.
Figure 3:
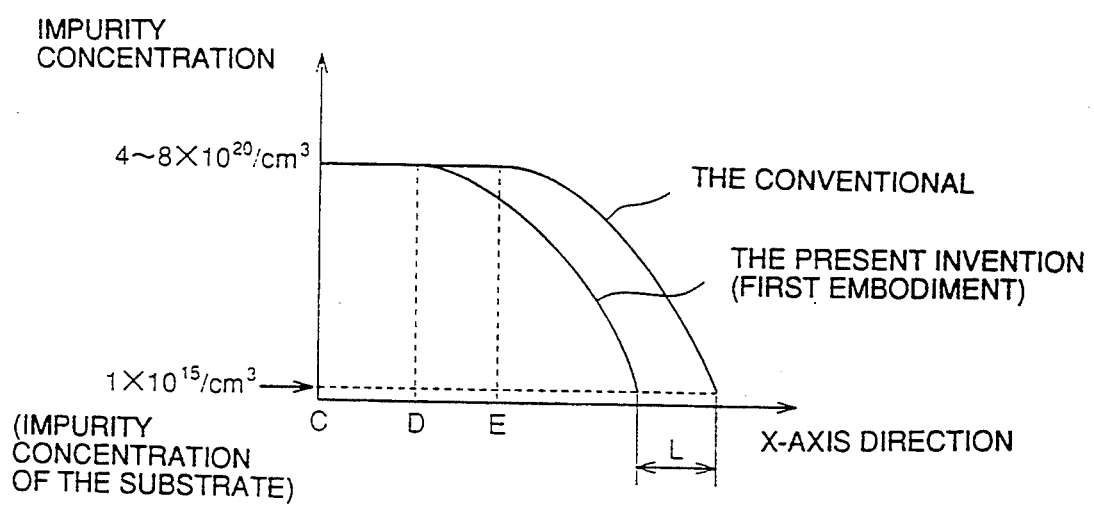
FIG. 3 is a diagram showing distribution of impurity concentration in which impurity concentration distribution of the contact portion of the capacitor lower electrode shown in FIG. 2 is compared with that of the contact portion of a conventional capacitor lower electrode.

FIG. 2 is an enlarged sectional view of a contact portion of capacitor lower electrode 9 of the DRAM according to the first embodiment shown in FIG. 1. FIG. 3 is a diagram showing a comparison between impurity concentration distribution along an X axis of the DRAM of the first embodiment and conventional impurity concentration distribution. With reference to FIGS. 2 and 3, the impurity concentration of the first embodiment is impurity concentration of capacitor lower electrode 9 ($4-8 \times 10^{20}/cm^3$) between a point C and a point D along the X axis shown in FIG. 2. When passing the point D, the impurity concentration gradually decreases. That is, the impurity concentration decreases continuously in epitaxial silicon layer 8 between the point D to a point E and in $n^+$ impurity diffusion layer 4 (single crystalline silicon substrate 1) after the point E. The impurity concentration along the X axis then decreases finally to impurity concentration ($1 \times 10^{15}/cm^3$) of single crystalline silicon substrate 1. On the other hand, in a conventional DRAM having no epitaxial silicon layer 8, a capacitor lower electrode is formed at a portion of epitaxial silicon layer 8 shown in FIG. 2 (the portion between the points D and E). Thus, as shown in FIG. 3, the impurity concentration is constant ($4-8 \times 10^{20}/cm^3$) from the point C to the point E in a conventional capacitor structure. After passing the point E, the impurity concentration first starts to decrease. That is, in the conventional structure, the impurity concentration starts to decrease when the impurities enter in $n^+$ impurity diffusion layer 4 on single crystalline silicon substrate 1. Thus, there is a difference in position where the impurity concentration decreases to the impurity concentration of single crystalline silicon substrate 1 ($1 \times 10^{15}/cm^3$) between the conventional capacitor structure and that of the first embodiment. In other words, as shown in FIG. 3, there is a difference only by L portion in the position where the respective impurity concentration decrease to the impurity concentration of single crystalline silicon substrate 1 ($1 \times 10^{15}/cm^3$) between the capacitor structure of the first embodiment and the conventional capacitor structure. This represents that a diffusion distance of impurities can be decreased by the L portion in the capacitor structure of the first embodiment as compared with the conventional capacitor structure. Thus, when a heat treatment at about 850° C. is carried out for flattering of, for example, interlayer insulating films 12, 14 (see FIG. 1), diffusion of the impurities in $n^+$ impurity diffusion layer is reduced compared to the conventional case. As a result, protrusion of the end portion of $n^+$ impurity diffusion layer 4 on the side of gate electrode 6 from the end portion of $n^+$ impurity implantation layer 3b on the side of gate electrode 6, as in the conventional case, can be effectively prevented. Hence, a short channel effect can be effectively prevented without shortening a length of channel region 16 as in the conventional case. In addition, a so-called punch through phenomenon can be effectively prevented, in which a depletion layer in the vicinity of $n^+$ impurity implantation layer 3a which is to be a drain region in, for example, data writing spreads to the extended $n^+$ impurity diffusion layer 4 which is to be a source region and thus current can not be controlled by a gate voltage. Even if there are variations in alignment of gate electrode 6 and capacitor lower electrode 9 at the time of patterning, the end portion of $n^+$ impurity diffusion layer 4 on the side of gate electrode 6 is not extended from the end portion of $n^+$ impurity implantation layer 3b on the side of gate electrode 6, since diffusion of impurities in $n^+$ impurity implantation layer 4 is decreased. As a result, the channel length of channel 16 can be controlled by $n^+$ impurity implantation layer 3b formed in a self-aligned manner, so that transistor characteristics are stable independent of the variations of alignment of gate electrode 6 and capacitor lower electrode 9.

Referring to FIGS. 1 and 4 through 12, a manufacturing method of the DRAM according to the embodiment will be described.

Figure 4:
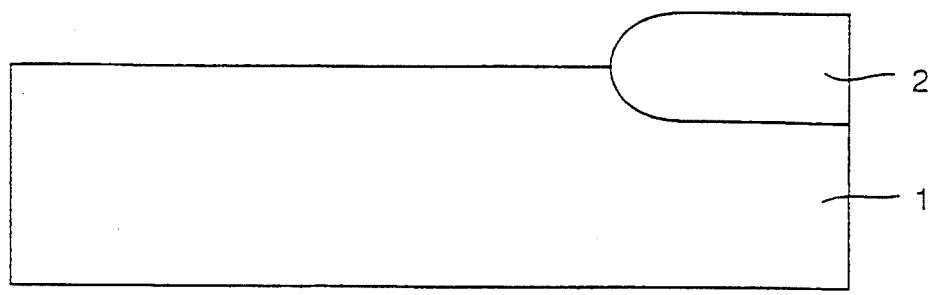
FIGS. 4 through 12 are sectional views showing respective steps of a manufacturing method of the DRAM according to the first embodiment shown in FIG. 1.

As shown in FIG. 4, a thick silicon oxide film (an isolation oxide film) 2 is selectively formed on the main surface of P type single crystalline silicon substrate 1 using a LOCOS method.

Figure 5:
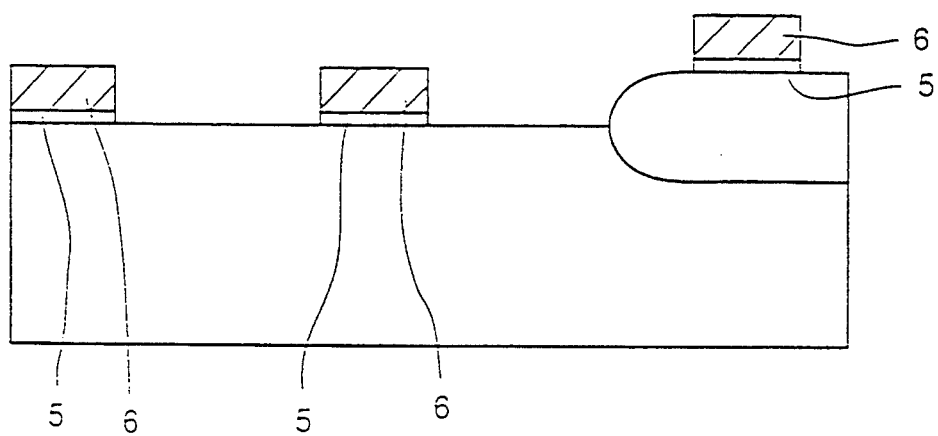

Referring to FIG. 5, a gate oxide film layer (not shown) is formed on the whole surface using a thermal oxidation method, and a low-resistance polycrystalline silicon layer (not shown) doped with phosphorus using the CVD method is formed thereon. Then patterning is carried out using lithography and dry etching to form a plurality of gate oxide films 5 and gate electrodes 6 with predetermined spaces therebetween.

Figure 6:
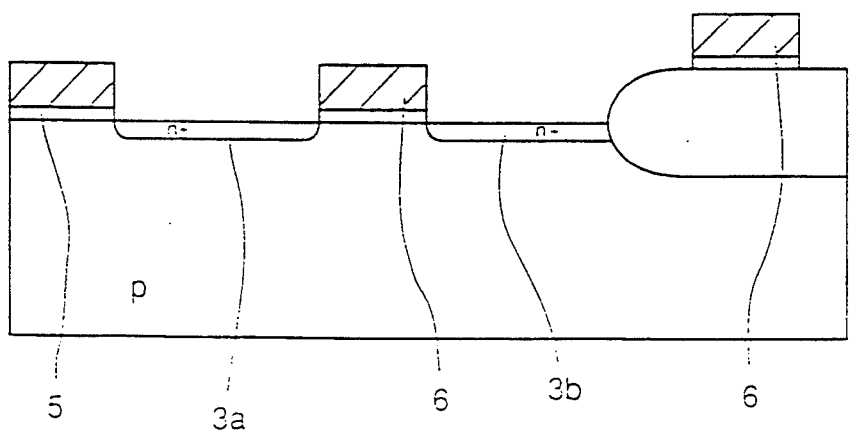

Referring to FIG. 6, arsenic (As) of $4 \times 10^{15}/cm^2$ is ion-implanted at 50 KeV using gate electrode 6 as a mask, so that $n^+$ impurity implantation layers 3a, 3b are formed.

Figure 7:
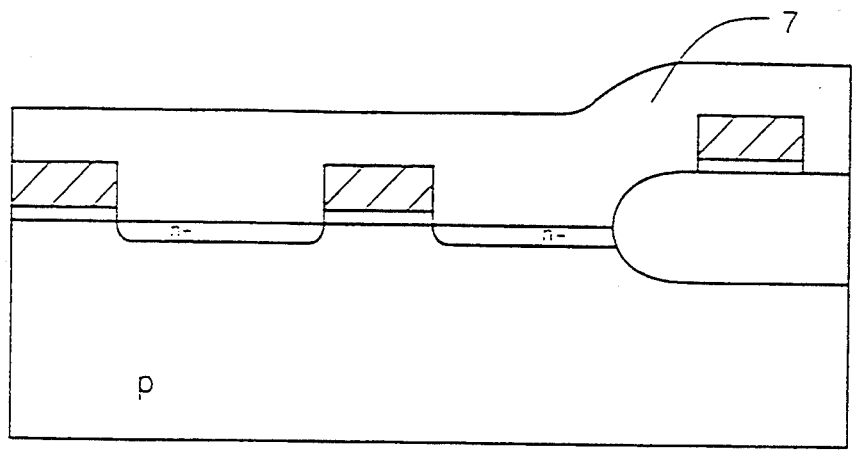

Referring to FIG. 7, interlayer insulating film 7 is formed on the whole surface using the CVD method.

Figure 8:
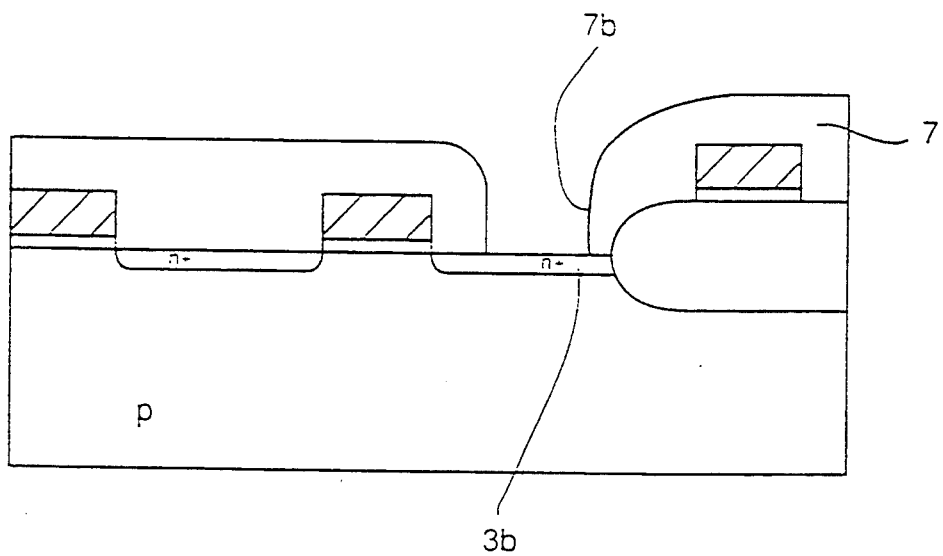

Referring to FIG. 8, contact hole 7b is formed in a region on $n^+$ impurity implantation layer 3b of interlayer insulating film 7 using lithography and dry etching.

Figure 9:
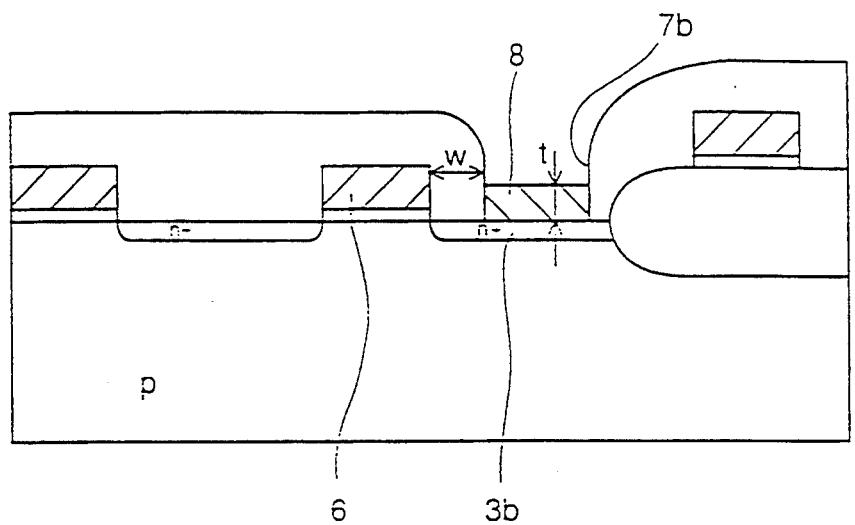

Referring to FIG. 9, silicon is epitaxially grown at about 700° C. for several tens of minutes on $n^+$ impurity implantation layer 3b exposed through contact hole 7b, so that epitaxial silicon layer 8 is formed. A thickness t of epitaxial silicon layer 8 should be set in such a range that end portion B of $n^+$ impurity diffusion layer 4 on the side of gate electrode 6 which is finally formed by diffusion is not extended from end portion A of $n^+$ impurity implantation layer 3b on the side of gate electrode 6, considering a space W between gate electrode 6 and capacitor lower electrode 9 (see FIG. 1) and an impurity concentration of capacitor lower electrode 9. The impurity concentration of epitaxial silicon layer 8 is about $1 \times 10^{15}/cm^3$ (corresponding to impurity concentration of single crystalline silicon substrate 1) under this condition. When, for example, W=0.3 μm, S=0.1 μm, it is preferable that t=0.2 μm with the impurity concentration of capacitor lower electrode 9 being $4-8 \times 10^{20}/cm^3$. The impurity concentration of epitaxial silicon layer 8 is set to an arbitrary value in accordance with outer parameters such as the impurity concentration of capacitor lower electrode 9.

Figure 10:
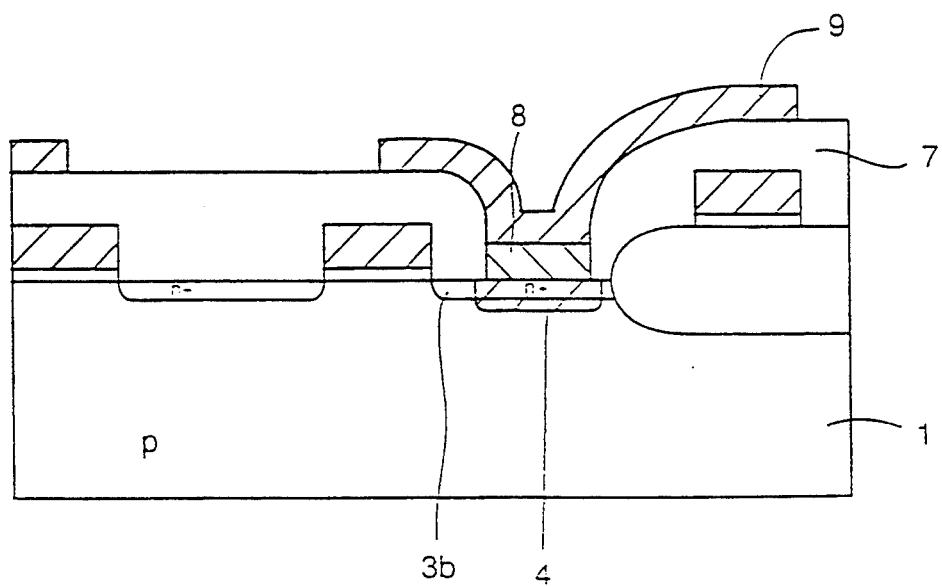

Referring to FIG. 10, a low-resistance polycrystalline silicon layer (not shown) doped with phosphorus (P) in $4-8 \times 10^{20}/cm^3$ is formed by the CVD method on epitaxial silicon layer 8 and interlayer insulating film 7. Capacitor lower electrode 9 is formed by patterning using usual lithography and dry etching. In forming capacitor lower electrode 9, heat at 700° C. is applied, so that impurities (phosphorus) in capacitor lower electrode 9 are thermally diffused toward single crystalline silicon substrate 1 through epitaxial silicon layer 8. $n^+$ impurity diffusion layer 4 is formed and capacitor lower electrode 9 and $n^+$ impurity implantation layer 3b are electrically connected.

Figure 11:
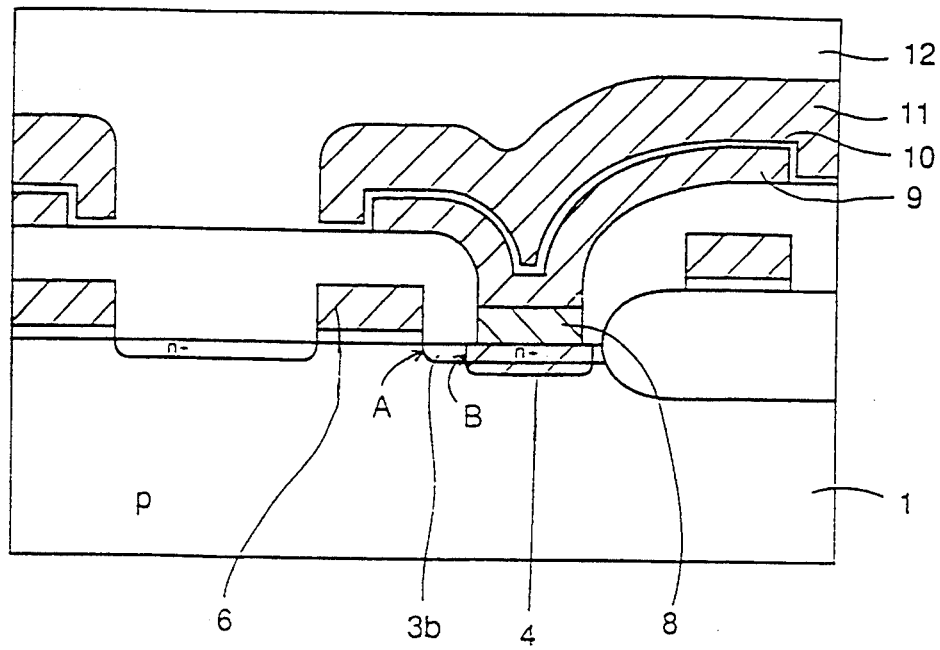

Referring to FIG. 11, capacitor dielectric film 10 of a single layered film such as a thermal oxide film, a multi-layered film having a structure of, for example, a silicon oxide film/a silicon nitride film/a silicon oxide film, or $Ta_2O_5$ and the like is formed on capacitor lower electrode 9. A low-resistance polycrystalline silicon layer (not shown) doped with phosphorus at about $4\text{--}8\times 10^{20}/\text{cm}^3$ is formed by the CVD method on capacitor dielectric film 10. Capacitor upper electrode 11 is formed by patterning, using lithography and dry etching. Interlayer insulating film 12 is formed using the CVD method. In order to flatten interlayer insulating film 12, a heat treatment at 850° C. is performed by the reflow method. Impurities (phosphorus) in capacitor lower electrode 9 is further diffused into single crystalline silicon substrate 1 by this heat treatment; however, a degree of the diffusion is also decreased by epitaxial silicon layer 8. As a result, end portion B of n+ impurity diffusion layer 4 on the side of gate electrode 6 formed by diffusion is not extended from end portion A of n+ impurity implantation layer 3b on the side of gate electrode 6.

Figure 12:
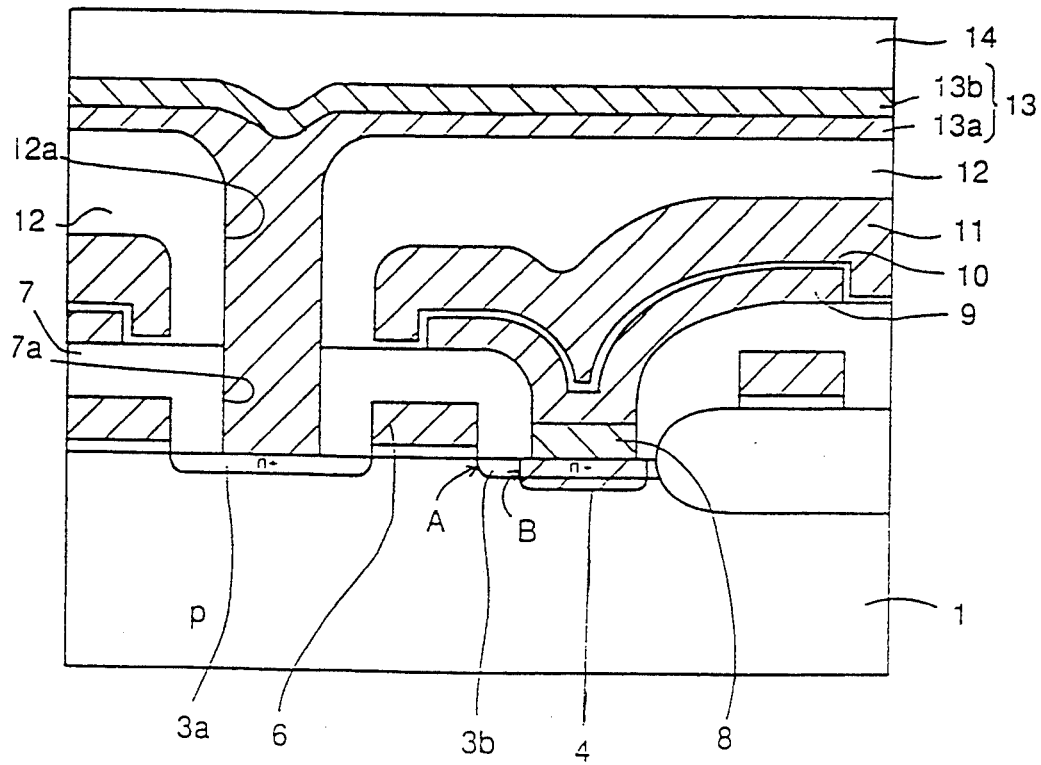

Referring to FIG. 12, contact holes 7a, 12a are formed on n+ impurity implantation layer 3a of interlayer insulating film 7, 12, respectively. A polycrystalline silicon film 13a is formed to extend on interlayer insulating film 12 and electrically connect with n+ impurity implantation layer 3a in contact hole 7a, 12a. A silicide film 13b of WSi₂ or the like is formed using a sputtering method on polycrystalline silicon film 13a. An interlayer insulating film 14 is formed on silicide film 13b. A heat treatment by the reflow method at 850° C. is carried out for flattening the surface of interlayer insulating film 14. In the heat treatment, the impurities (phosphorus) in capacitor lower electrode 9 are also thermally diffused toward single crystalline silicon substrate 1; however, diffusion is again decreased because of epitaxial silicon layer 8. As a result, the end portion of n+ impurity diffusion layer 4 on the side of gate electrode 6 formed by diffusion is not extended from the end portion of n+ impurity implantation layer 3b on the side of gate electrode 6.

Thus, epitaxial silicon layer 8 effectively prevents the end portion of n+ impurity diffusion layer 4 on the side of gate electrode 6 from being extended from the end portion of n+ impurity implantation layer 3b on the side of gate electrode 6 in the heat treatment for flattening interlayer insulating layers 12, 14. Therefore, different from the conventional case, the effective gate length (channel length) is not shortened and a short channel effect, a punch through phenomenon and the like can be effectively prevented.

Figure 13:
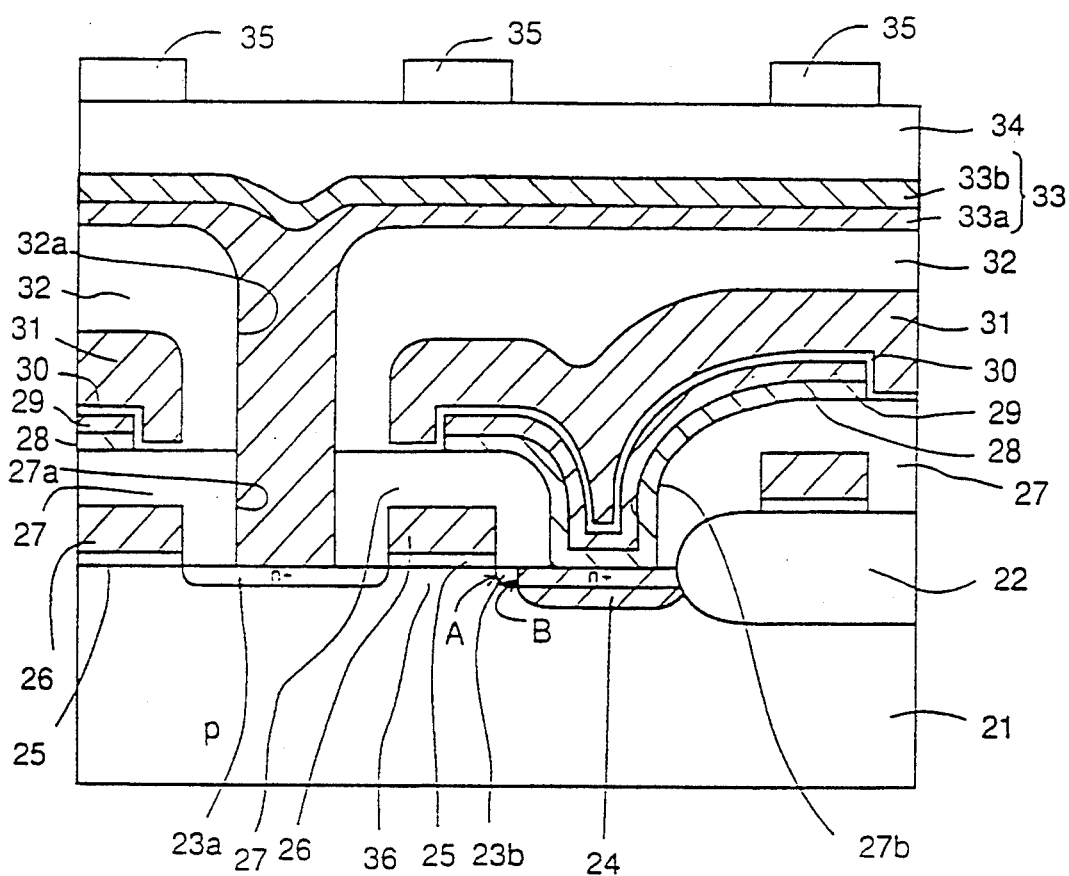
FIG. 13 is a sectional view showing a DRAM having a stacked-type capacitor according to a second embodiment of the present invention.
Figure 14:
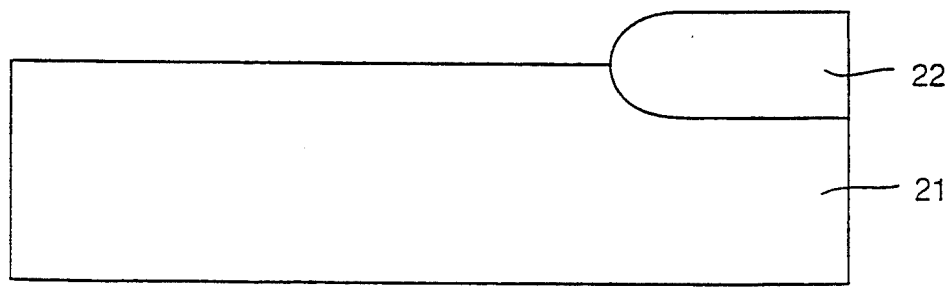
FIGS. 14 through 22 are sectional views showing respective steps of a manufacturing method of the DRAM according to the second embodiment shown in FIG. 13.
Figure 15:
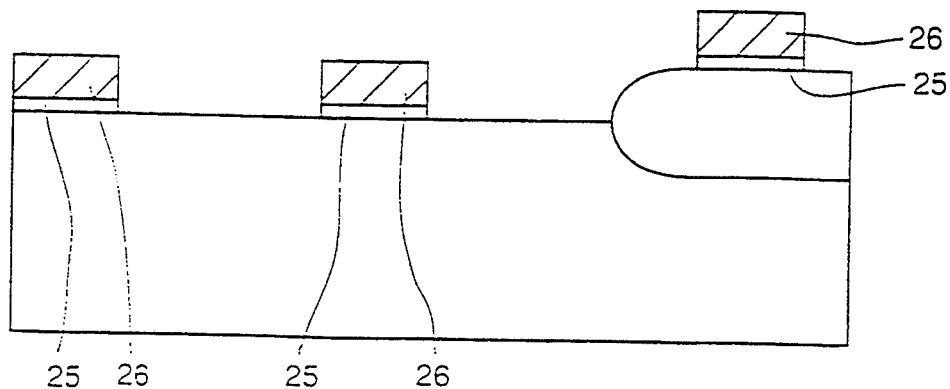
Figure 16:
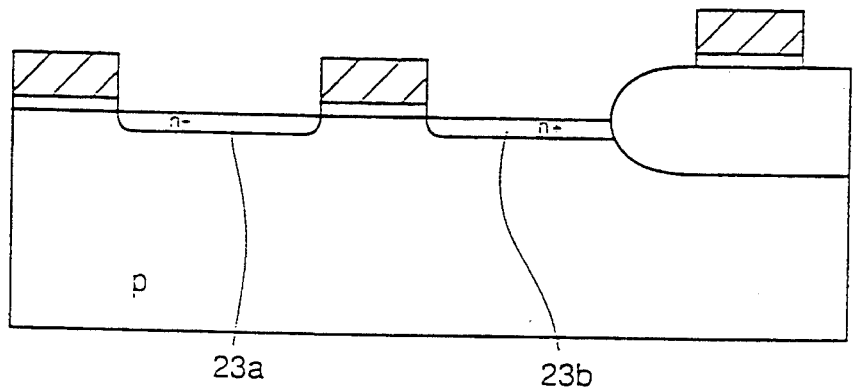
Figure 17:
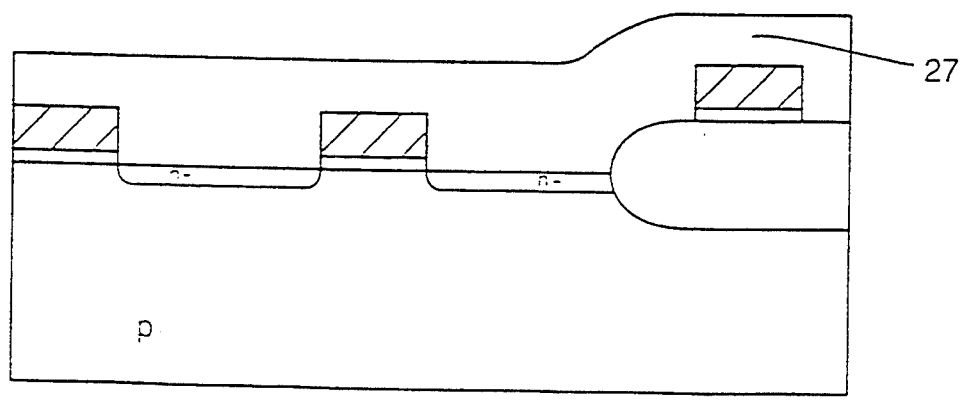
Figure 18:
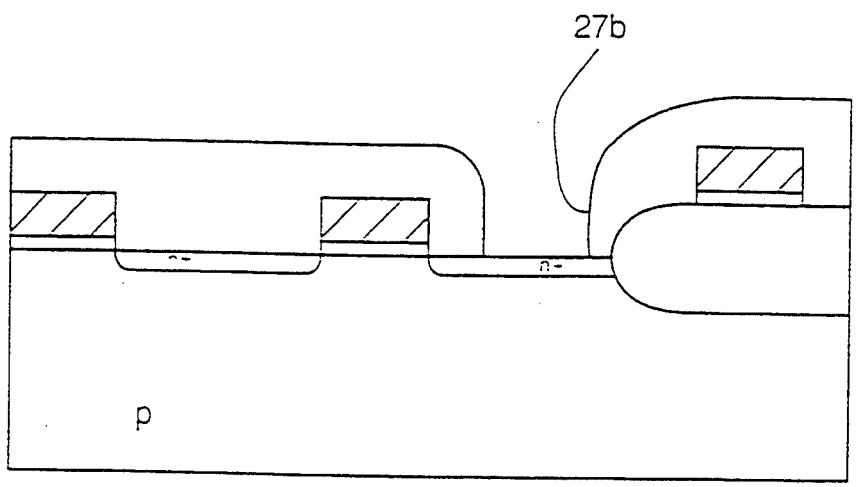

Referring to FIG. 13, a DRAM according to a second embodiment includes a P type single crystalline silicon substrate 21; an isolation oxide film 22 formed in a predetermined region on the main surface of single crystalline silicon substrate 21; a pair of n+ impurity implantation layers (source/drain regions) 23a, 23b formed in a region surrounded with isolation oxide film 22 to have a channel region 36 interposed with a predetermined space therebetween; a gate electrode 26 formed on channel region 36 with a gate oxide film 25 interposed; an interlayer insulating film 27 formed to cover the whole surface and having contact holes 27a, 27b on n+ impurity implantation layers 23a, 23b, respectively; a high-resistance polycrystalline silicon film 28 containing a small amount of impurities (phosphorus) formed to connect with n+ impurity implantation layer 23b in contact hole 27b and extend along interlayer insulating film 27; a capacitor lower electrode 29 formed on polycrystalline silicon film 28 and having an impurity concentration (phosphorus (P) of about $4\text{--}8\times 10^{20}/\text{cm}^3$) higher than that of the polycrystal silicon film 28; a capacitor dielectric film 30 formed of a single layered film such as a thermal oxide film, a multi-layered film having a structure of, for example, a silicon oxide film, and a silicon nitride film, and a silicon oxide film, or Ta₂O₅ and the like on capacitor lower electrode 29; a capacitor upper electrode 31 formed on capacitor dielectric film 30 and having almost the same impurity concentration (phosphorus (P) of $4\text{--}8\times 10^{20}/\text{cm}^3$) as that of capacitor lower electrode 29; an n+ impurity diffusion layer 24 formed by thermal diffusion of the impurities (phosphorus) in capacitor lower electrode 29 through polycrystalline silicon film 28; an interlayer insulating film 32 formed to cover the whole surface and having a contact hole 32a above n+ impurity implantation layer 23a; polycrystalline silicon film 33a doped with impurities, electrically connected to n+ impurity implantation layer 23a in contact holes 27a, 32a and extending along interlayer insulating film 32; a silicide film 33b of WSi₂ or the like formed on polycrystalline silicon film 33a; an interlayer insulating film 34 formed on silicide film 33b; and aluminum interconnection 35 formed on interlayer insulating film 34 with predetermined spaces therebetween.

In the second embodiment, polycrystalline silicon film 28 having an impurity concentration lower than that of capacitor lower electrode 29 is interposed between capacitor lower electrode 29 and n+ impurity implantation layer 23b, so that, as in the first embodiment shown in FIG. 1, diffusion of impurities in n+ impurity diffusion layer 24 formed by the diffusion can be decreased. That is, the impurities (phosphorus) in capacitor lower electrode 29 diffused into single crystalline silicon substrate 21 can be reduced in the heat treatment for flattening interlayer insulating films 32, 34. As a result, end portion B of n+ impurity diffusion layer 24 on the side of gate electrode 26 can be effectively prevented from being extended from end portion A of n+ impurity implantation layer 23b on the side of gate electrode 26 in the above mentioned heat treatment for interlayer insulating films 32, 34. Consequently, as shown in FIG. 1, a short channel effect which lowers a threshold voltage, a punch through phenomenon and furthermore variations of transistor characteristics depending on variations of alignment of gate electrode 26 and capacitor lower electrode 29 at the time of patterning can be effectively prevented.

Referring to FIGS. 13 through 22, a manufacturing method of a DRAM according to a second embodiment will be described.

Figure 19:
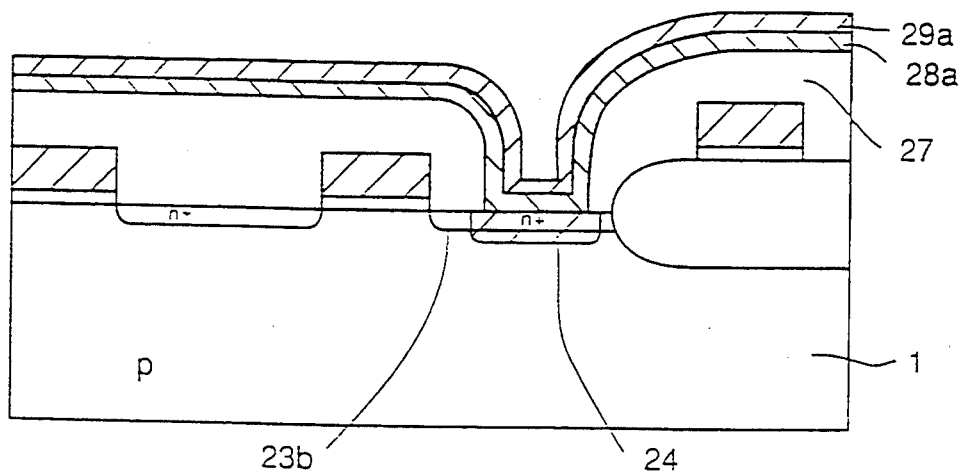

The steps shown in FIGS. 14 through 18 (a first step through a fifth step) are the same as those in the manufacturing method of the first embodiment shown in FIGS. 4 through 8. Following these steps, as shown in FIG. 19, a high-resistance polycrystalline silicon film layer 28a (the impurity concentration is $1\times 10^{15}/\text{cm}^3$) is formed and capacitor lower electrode layer 29a of a low-resistance polycrystalline silicon layer including a large amount of phosphorus ($4\text{--}8\times 10^{20}/\text{cm}^3$) is formed thereon. In forming polycrystalline silicon film layer 28a and capacitor lower electrode layer 29a, heat at 700° C. is applied and the impurities in capacitor lower electrode layer 29a are thermally diffused into single crystalline silicon substrate 1 through polycrystalline silicon film layer 28a. As a result, n+ impurity diffusion layer 24 is formed, and n+ impurity implantation layer 23b and capacitor lower electrode layer 29a are electrically connected. The diffusion of the impurities from capacitor lower electrode layer 29a is decreased compared to the conventional case because of the existence of polycrystalline silicon film layer 28a.

Figure 20:
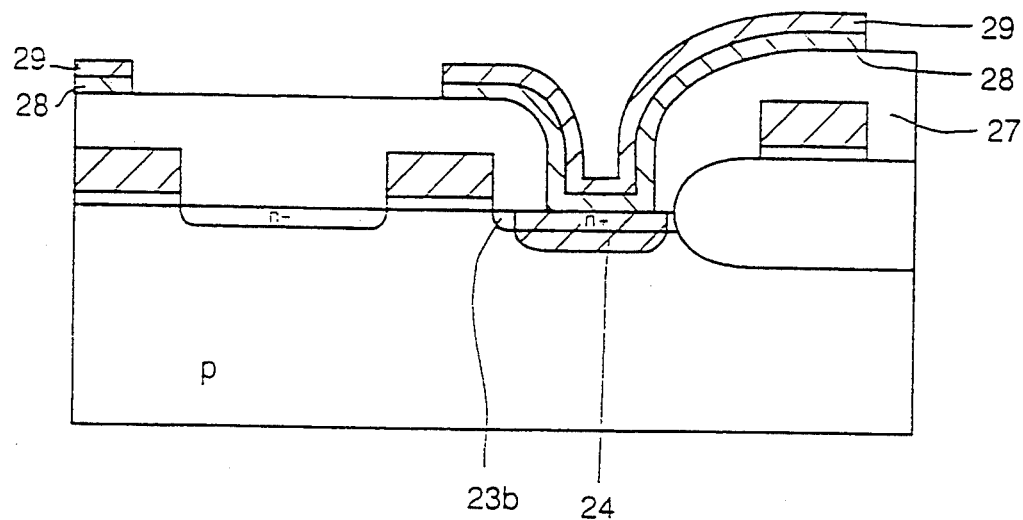

Referring to FIG. 20, polycrystalline silicon film layer 28a and capacitor lower electrode layer 29a are patterned using common lithography and dry etching to form a polycrystalline silicon film 28 and a capacitor lower electrode 29.

Figure 21:
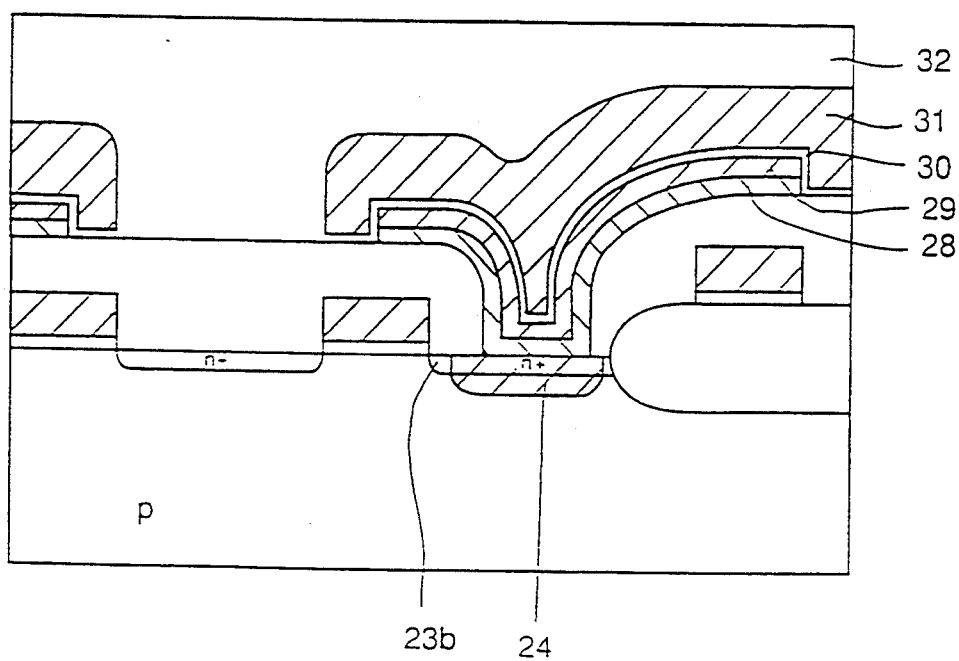

Referring to FIG. 21, capacitor dielectric film 30 is formed of a single layered film such as a thermal oxide film, a multi-layered film having a structure of, for example, a silicon oxide film/a silicon nitride film/a silicon oxide film, or $Ta_2O_5$ and the like on capacitor lower electrode 29. Capacitor upper electrode 31 of a low-resistance polycrystalline silicon film having the same impurity concentration (phosphorus) $(4-8 \times 10^{20}/cm^3)$ as that of capacitor lower electrode 29 is formed on capacitor dielectric film 30. Interlayer insulating film 32 is formed using the CVD method on the whole surface. For flattening the surface of interlayer insulating film 32, a heat treatment is carried out at a temperature of 850° C. by the reflow method.

Figure 22:
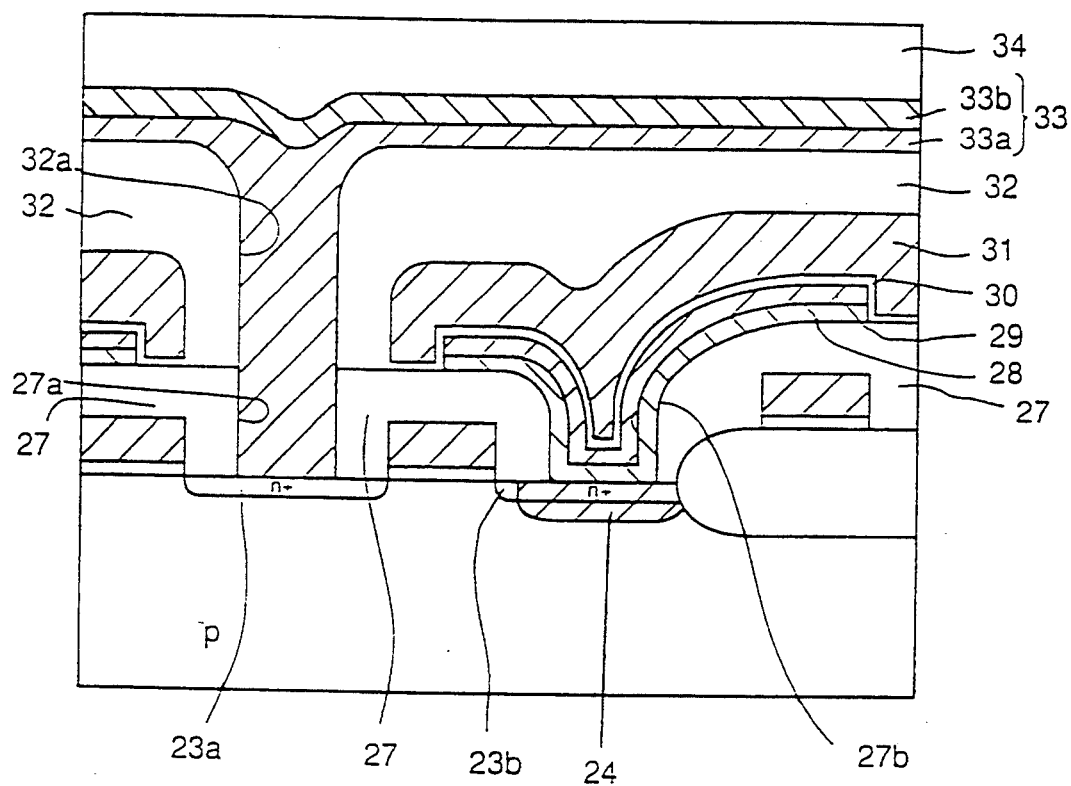

Referring to FIG. 22, contact holes 27a, 32a are formed on n+ impurity implantation layer 23a in interlayer insulating films 27, 32, respectively. Polycrystalline silicon film 33a electrically connecting with n+ impurity implantation layer 23a in contact hole 27a, 32a is formed using the CVD method to extend on interlayer insulating film 32. Silicide film 33b of $WSi_2$ or the like is formed using the sputtering method on polycrystalline silicon film 33a. Interlayer insulating film 34 is formed on silicide film 33b using the CVD method. For flattening the surface of interlayer insulating film 34, a heat treatment at a temperature of 850° C. is carried out by the reflow method.

Finally, as shown in FIG. 13, aluminum interconnections 35 are formed with predetermined spaces therebetween on interlayer insulating film 34. Thus, the DRAM of the second embodiment is finished.

Figure 23:
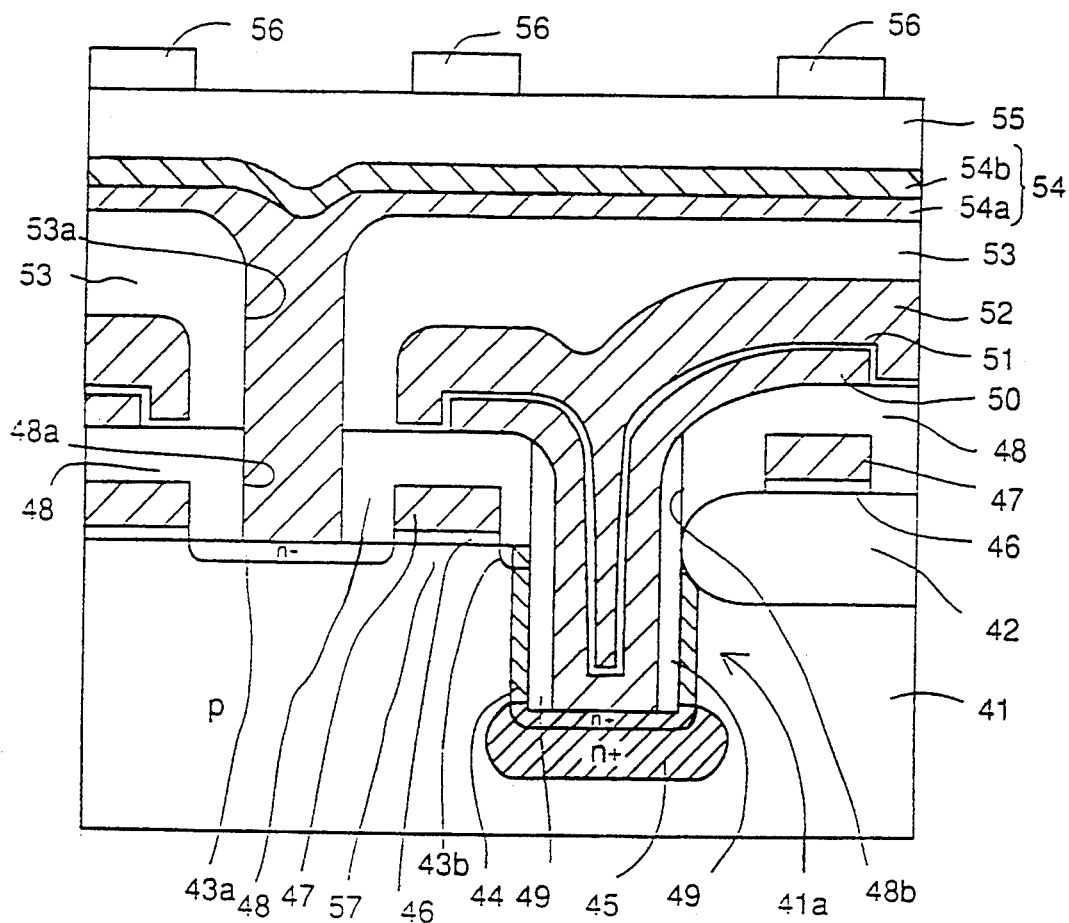
FIG. 23 is a sectional view showing a DRAM having a stacked-type capacitor according to a third embodiment of the present invention.
Figure 24:
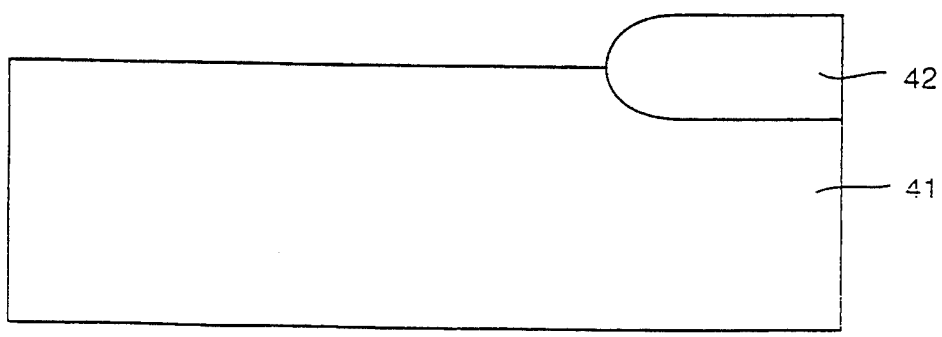
FIGS. 24 through 33 are sectional views showing respective steps of a manufacturing method of the DRAM according to the third embodiment shown in FIG. 23.
Figure 25:
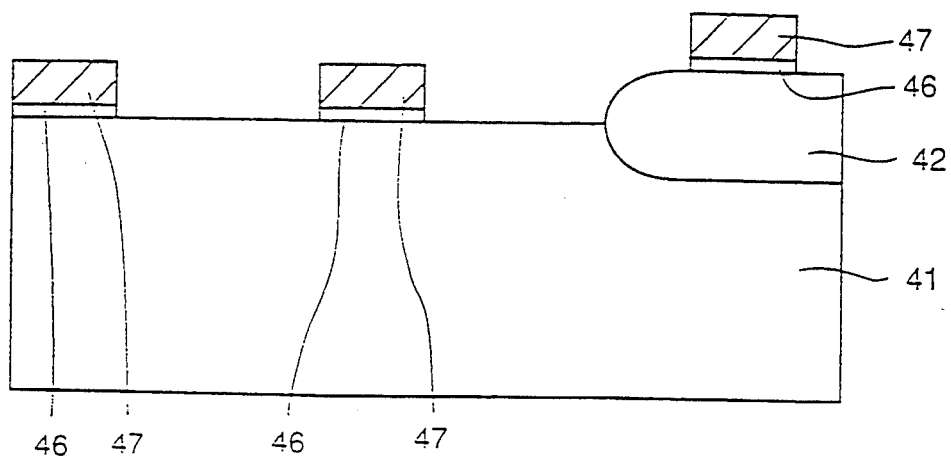
Figure 26:
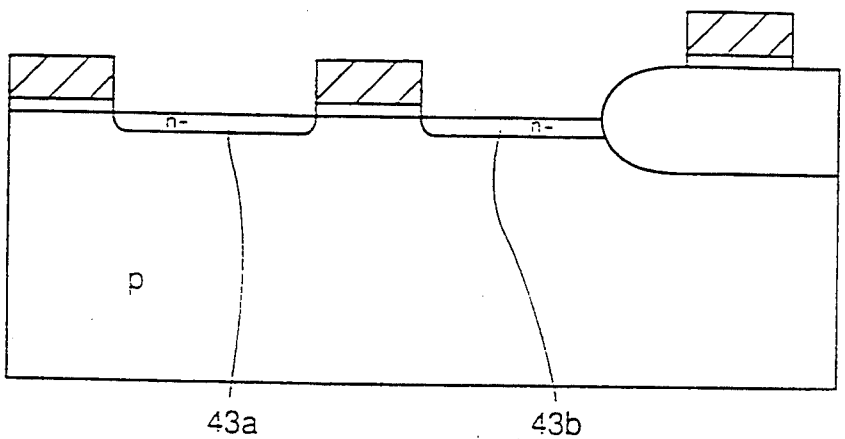
Figure 27:
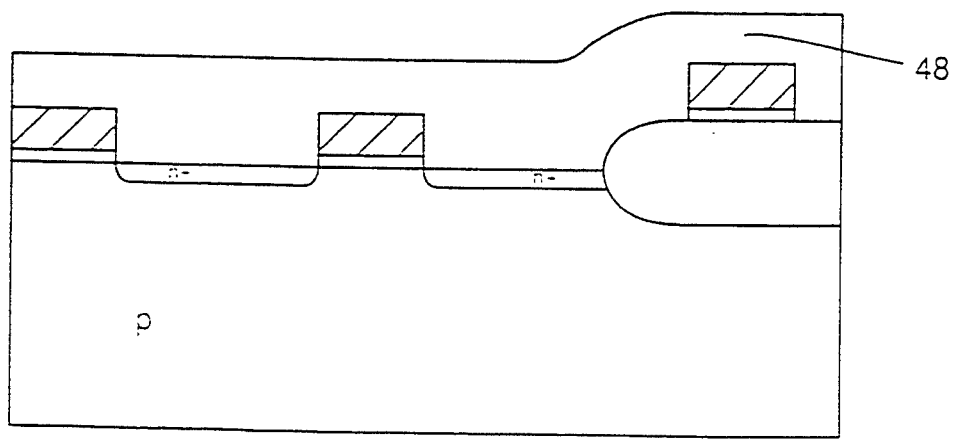

Referring to FIG. 23, a DRAM according to a third embodiment includes a P type single crystalline silicon substrate 41 having a trench 41a in a predetermined region of its main surface; an isolation oxide film (a thick silicon oxide film) 42 adjacent to trench 41a for isolating elements formed on the main surface of single crystalline silicon substrate 41; n+ impurity implantation layer 43b whose end portion is adjacent to a sidewall portion of trench 41a; n+ impurity implantation layer 43a to have channel region 57 interposed with a predetermined space from n+ impurity implantation layer 43b; n+ impurity implantation layer 44 along the surface of trench 41a; a gate electrode 47 formed on channel region 57 with gate oxide film 46 interposed; an interlayer insulating film 48 formed to cover the whole surface and having contact holes 48a, 48b on n+ impurity implantation layer 43a and a recessed portion 41a, respectively; a sidewall insulating film 49 formed on sidewall portions of contact hole 48b of interlayer insulating film 48 and recessed portion 41a; a capacitor lower electrode 50 of a low-resistance polycrystalline silicon film containing a large amount of impurities (phosphorus (P) of $4-8 \times 10^{20}/cm^3$) electrically connected to n+ impurity implantation layer 44 at the bottom portion of recessed portion 41a and extending along sidewall insulating film 49 and interlayer insulating film 48; a capacitor dielectric film 51 of a single layered film such as a thermal oxide film, a multi-layered film having a structure of, for example, a silicon oxide film/a silicon nitride film/a silicon oxide film, or $Ta_2O_5$ and the like formed on capacitor lower electrode 50; a capacitor upper electrode 52 of a low-resistance polycrystalline silicon film containing almost the same amount of impurities $(4-8 \times 10^{20}/cm^3)$ as capacitor lower electrode 50 formed on capacitor dielectric film 51; an n+ impurity diffusion layer 45 formed through a thermal diffusion of the impurities (phosphorus) in capacitor lower electrode 50; an interlayer insulating film 53 formed to cover the whole surface and having a contact hole 53a, 48a above n+ impurity implantation layer 43a; a polycrystalline silicon film 54a electrically connected to n+ impurity implantation layer 43a in contact holes 48a, 53a and along a surface of interlayer insulating film 53; a silicide film 54b of WSi or the like formed on polycrystalline silicon film 54a; an interlayer insulating film 55 formed on silicide film 54b; and aluminum interconnections 56 formed on interlayer insulating film 55 with predetermined spaces therebetween.

A switching MOS transistor is comprised of a pair of n+ impurity implantation layers 43a, 43b, n+ impurity implantation layer 44 and gate electrode 47. A bit line 54 for transmitting a data signal is comprised of polycrystalline silicon film 54a and silicide film 54b. A stacked-type capacitor having trench 41a for storing charges corresponding to the data signal is comprised of capacitor lower electrode 50, capacitor dielectric film 51 and capacitor upper electrode 52.

In the third embodiment, trench 41a is formed in single crystalline silicon substrate 41, and sidewall insulating film 49 is formed on sidewall portions of trench 41a and interlayer insulating film 48, so that capacitor lower electrode 50 can electrically contact n+ impurity implantation layer 44 only at the bottom portion of trench groove 41a.

That is, in the third embodiment, capacitor lower electrode 50 is in electrical contact with n+ impurity implantation layer 44 at such a depth that n+ impurity diffusion layer 45 finally formed by impurity diffusion from capacitor lower electrode 50 does not overlap a region where channel region 57 is formed. With this structure, even if the diffusion region of n+ impurity diffusion layer 45 is widened through a heat treatment for flattening interlayer insulating films 53, 55 as in the conventional case, n+ impurity diffusion layer 45 does not overlap channel region 57 between n+ impurity implantation layers 43a and 43b. As a result, the effect gate length is not shortened, and as in the first and second embodiments, a short channel effect in which a threshold voltage decreases and a punch through phenomenon can be effectively prevented. In addition, even if the diffusion location of n+ impurity diffusion layer 45 varies depending on variations in alignment of gate electrode 47 and capacitor lower electrode 50 at the time of patterning, the channel length of the embodiment is defined by n+ impurity implantation layer 43b formed in a self align manner, so that transistor characteristics do not vary unlike those in the conventional case.

Referring to FIGS. 23 through 33, a manufacturing method of a DRAM according to a third embodiment will be described.

The manufacturing steps shown in FIGS. 24 through 27 are the same as those in the first embodiment shown in FIGS. 4 through 7.

Figure 28:
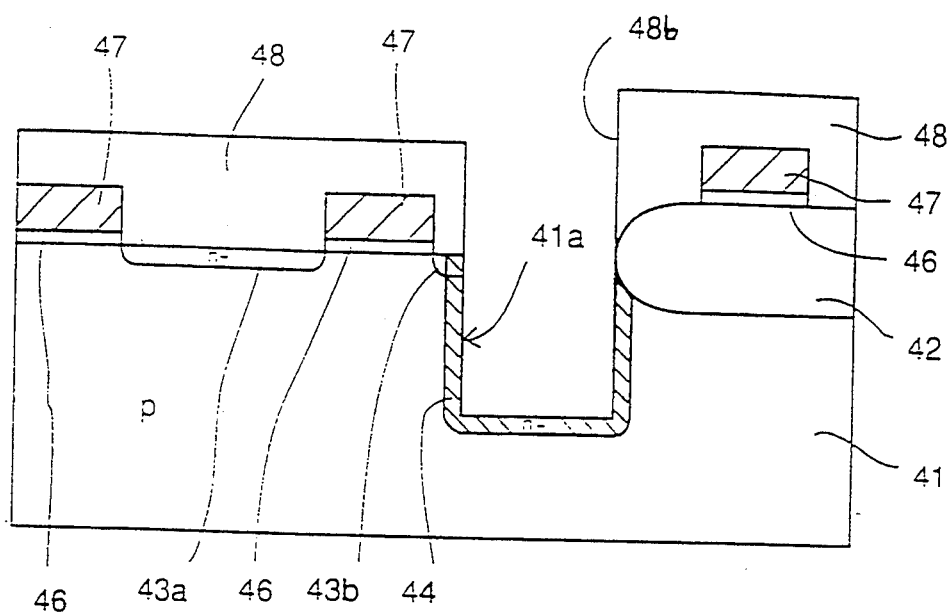

Following these steps, as shown in FIG. 28, trench groove 41a and contact hole 48b are formed in a region spaced given distance apart from gate electrode 47 of n+ impurity implantation layer 43b using common lithography and dry etching. n+ impurity implantation layer 44 is formed in the side surface and the bottom surface of trench groove 41a using an oblique ion implantation method to have almost the same impurity concentration as that of n+ impurity implantation layer 43b.

Figure 29:
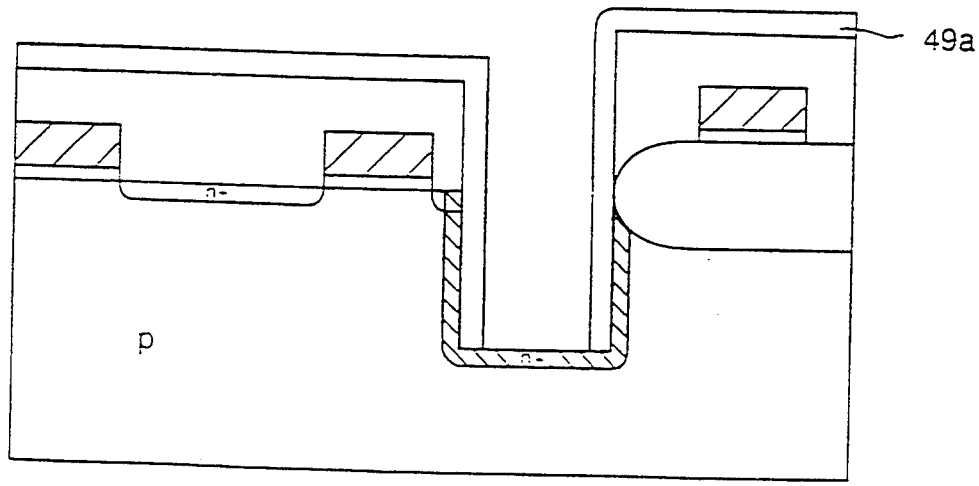

As shown in FIG. 29, oxide film 49a having a thickness of not less than 500 Å is formed on the whole surface using the CVD method.

Figure 30:
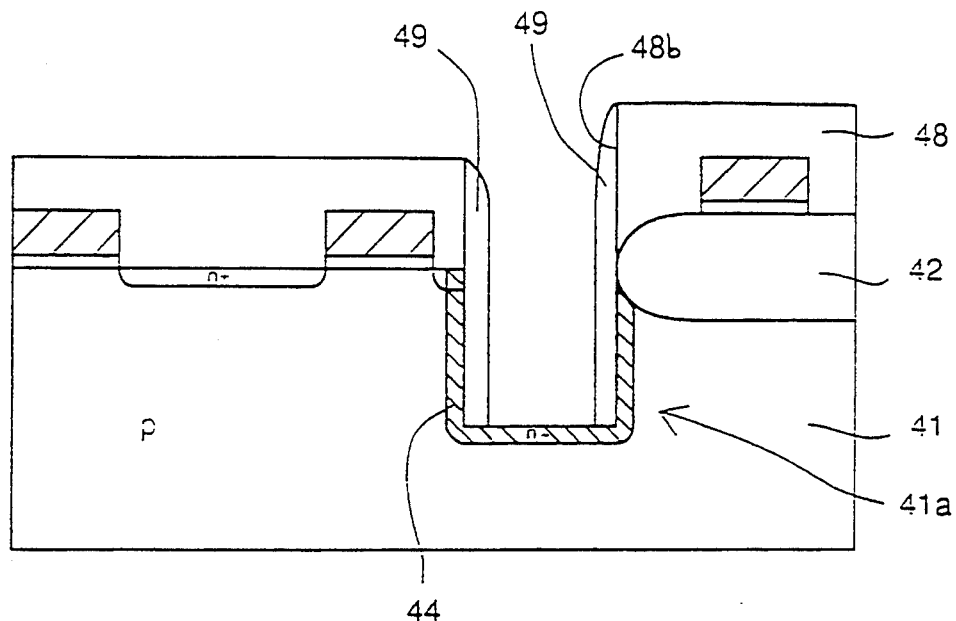

Referring to FIG. 30, sidewall insulating film 49 is formed only on the sidewall portions of contact hole 48a and trench groove 41a by anisotropic etching.

Figure 31:
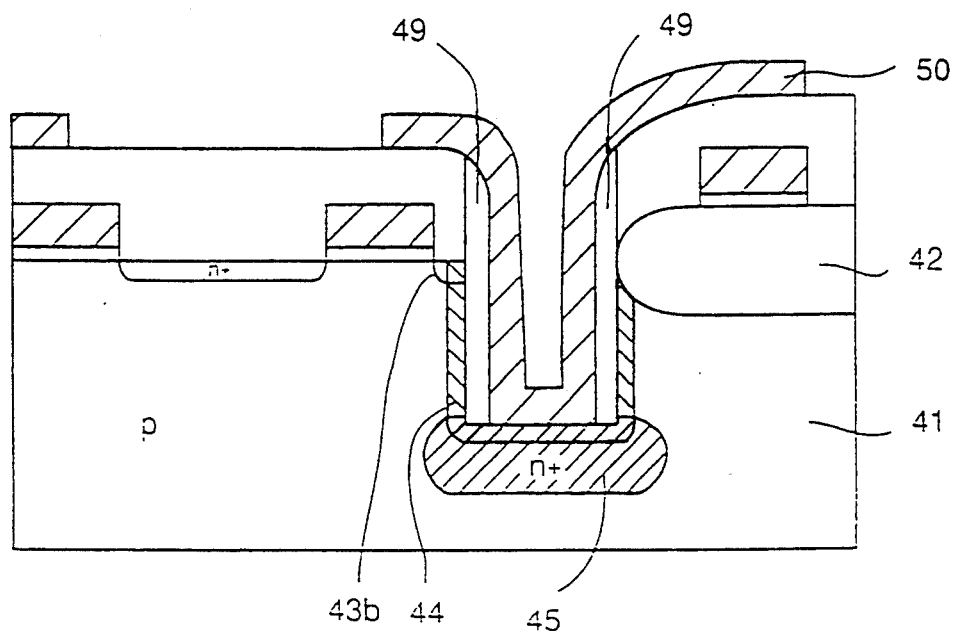

Referring to FIG. 31, capacitor lower electrode 50 is formed by patterning after a low-resistance polycrystalline silicon layer (not shown) doped with phosphorus of about $4$–$8 \times 10^{20}$/cm$^3$ is formed using the CVD method. In forming capacitor lower electrode 50, heat at about 700° C. is applied, so that the impurities (phosphorus) in capacitor lower electrode 50 are thermally diffused toward single crystalline silicon substrate 41. As a result, n+ impurity diffusion layer 45 is formed, and n+ impurity implantation layer 44 and capacitor lower electrode 50 are electrically connected.

Figure 32:
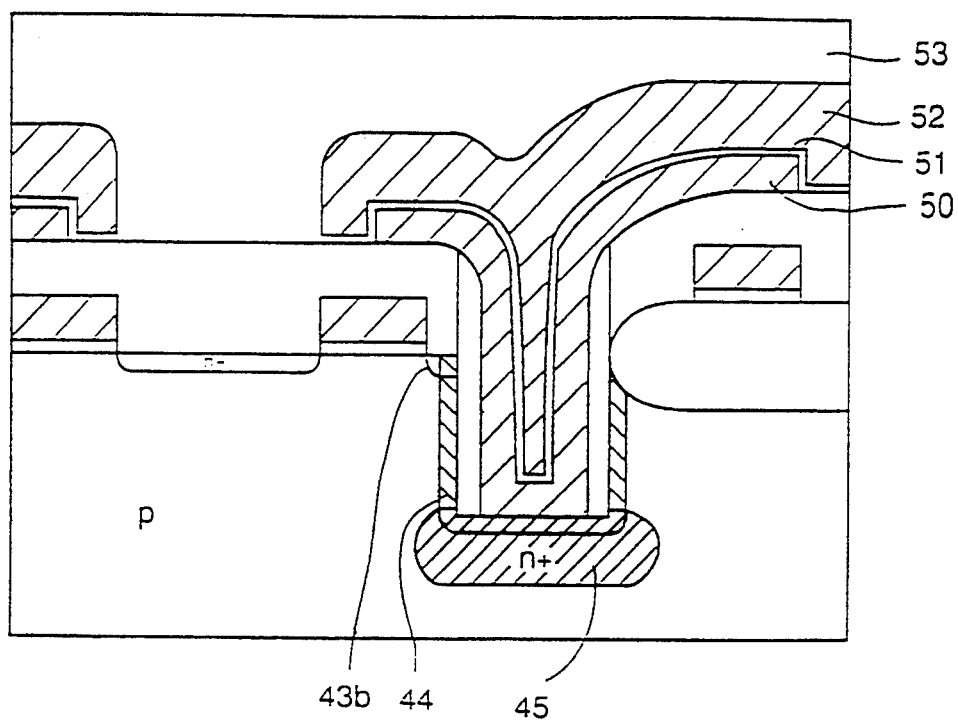

Referring to FIG. 32, capacitor dielectric film 51 of a single layered film such as a thermal oxide film, a multi-layered film having a structure of, for example, a silicon oxide film/a silicon nitride film/a silicon oxide film, or $Ta_2O_5$ and the like is formed on capacitor lower electrode 50. Capacitor upper electrode 52 of a low-resistance polycrystalline silicon film having almost the same impurity concentration ($4$–$8 \times 10^{20}$/cm$^3$) as that of the capacitor lower electrode using the CVD method, lithography and dry etching on capacitor dielectric film 51. Interlayer insulating film 53 is formed on the whole surface using the CVD method. For flattening the surface of interlayer insulating film 53, a heat treatment is carried out at temperature of 850° C. using the reflow method.

Figure 33:
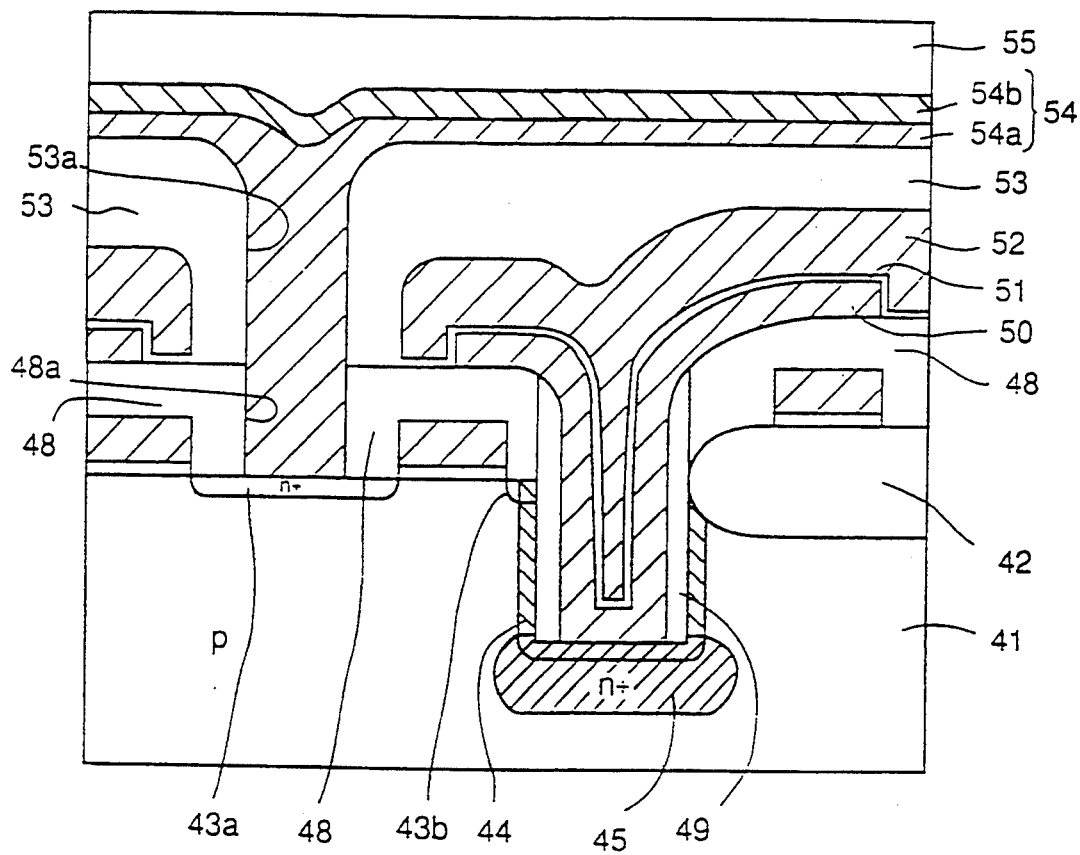

Referring to FIG. 33, contact holes 48a, 53a are formed in a region of interlayer insulating films 48, 53, respectively on n+ impurity implantation layer 43a. Polycrystalline silicon film 54a is formed to be electrically connected to n+ impurity implantation layer 43a in contact holes 48a, 53a and to extend along interlayer insulating film 53 using the CVD method. A silicide film 54b of $WSi_2$ or the like is formed on polycrystalline silicon film 54a using the sputtering method. Interlayer insulating film 55 is formed on silicide film 54b using the CVD method. A heat treatment is carried out at a temperature of 850° C. using the reflow method for flattening the surface of interlayer insulating film 55.

Finally, as shown in FIG. 23, aluminum interconnections 56 are formed on interlayer insulating film 55 with predetermined spaces therebetween. Thus, the DRAM of the third embodiment is finished.

Figure 34:
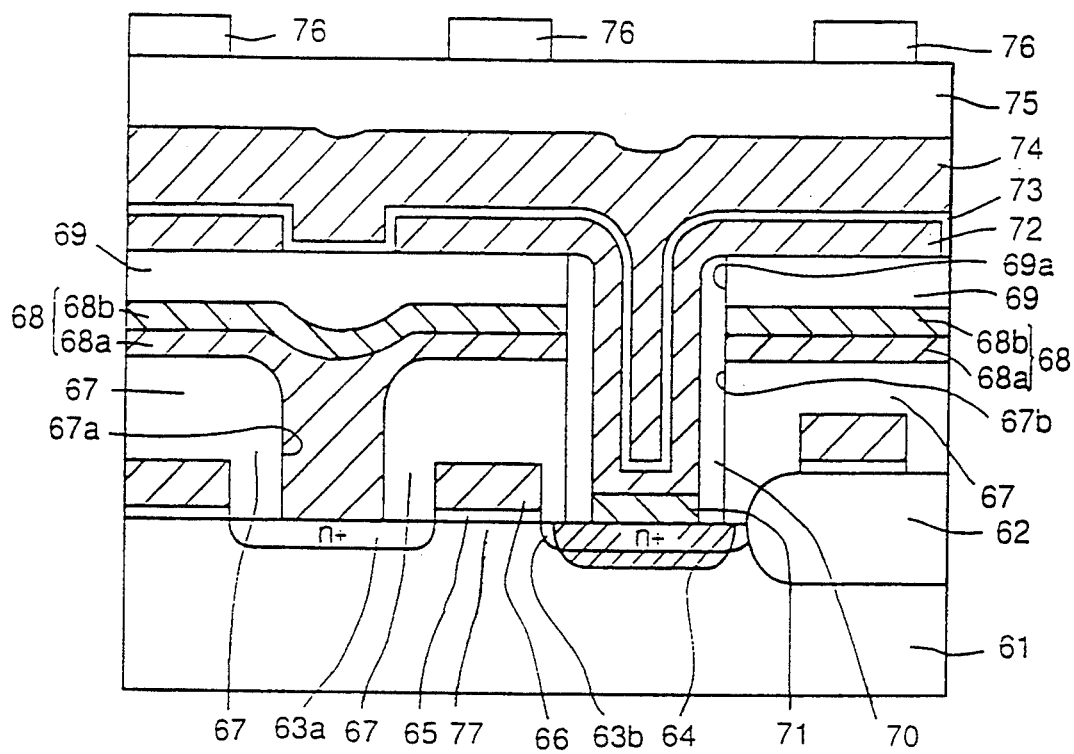
FIG. 34 is a sectional view showing a DRAM having a stacked-type capacitor according to a fourth embodiment of the present invention.

Referring to FIG. 34, in a fourth embodiment, an isolation oxide film 62 for isolating elements is formed in a predetermined region of the main surface of P type semiconductor substrate 61. A pair of n+ impurity implantation layers 63a, 63b are formed with a predetermined space to have channel region 77 interposed therebetween in a region surrounded by isolation oxide film 62. A gate electrode 66 is formed on channel region 77 through gate oxide film 65. An interlayer insulating film 67 having contact holes 67a, 67b on n+ impurity implantation layers 63a, 63b, respectively is formed to cover the whole surface. Polycrystalline silicon film 68a forming bit line 68 is formed to be electrically connected to n+ impurity implantation layer 63a in contact hole 67a and to extend on interlayer insulating film 67. A silicide film 68b of $WSi_2$ or the like forming bit line 68 is formed on polycrystalline silicon film 68a. Interlayer insulating film 69 having a contact hole 67b, 69a above n+ impurity implantation layer 63b is formed to cover silicide film 68b. Interlayer insulating film 70 is formed in a predetermined thickness on the surface of contact holes 67b, 69a. An epitaxial silicon layer 71 is formed through an epitaxial growth on n+ impurity implantation layer 63b in a region surrounded by sidewall insulating film 70. Capacitor lower electrode 72 of a low-resistance polycrystalline silicon film having an impurity concentration ($4$–$8 \times 10^{20}$/cm$^3$) higher than that of epitaxial silicon layer 71 is formed on epitaxial silicon layer 71. Capacitor lower electrode 72 extends on sidewall insulating film 70 and interlayer insulating film 69. n+ impurity diffusion layer 64 is formed by heat diffusion of the impurities contained in capacitor lower electrode 72 to overlap n+ impurity implantation layer 63b. Capacitor dielectric film 73 of a single layered film such as a thermal oxide film, a multi-layered film having a structure of, for example, a silicon oxide film/a silicon nitride film/a silicon oxide film, or $Ta_2O_5$ and the like is formed on capacitor lower electrode 72. Capacitor upper electrode 74 of a low-resistance polycrystalline silicon film having approximately the same concentration ($4$–$8 \times 10^{20}$/cm$^3$) as that of capacitor lower electrode 72 on capacitor dielectric film 73. Interlayer insulating film 75 whose surface is flattened is formed on capacitor upper electrode 74. Aluminum interconnections 76 are formed with predetermined spaces therebetween on internal insulating film 75.

In the fourth embodiment, epitaxial silicon layer 71 having an impurity concentration ($1 \times 10^{15}$/cm$^3$ before the diffusion of the impurities in capacitor lower electrode 72) lower than that of capacitor lower electrode 72 is interposed between capacitor lower electrode 72 and n+ impurity implantation layer 63b, as in the first embodiment, so that the impurity diffusion in capacitor lower electrode 72 can be reduced, and also diffusion of n+ impurity diffusion layer 64 can be reduced in comparison with the conventional case. As a result, a disadvantage is not caused that the end portion of n+ impurity diffusion layer 64 on the side of gate electrode 66 is not extended from the end portion of n+ impurity implantation layer 63b on the side of gate electrode 66 and that the effective gate length is shortened. A short channel effect and a punch through phenomenon can be effectively prevented, as in the first embodiment.

In the fourth embodiment, bit line 68 is located under capacitor lower electrode 72, unlike in the first embodiment shown in FIG. 1.

Figure 35:
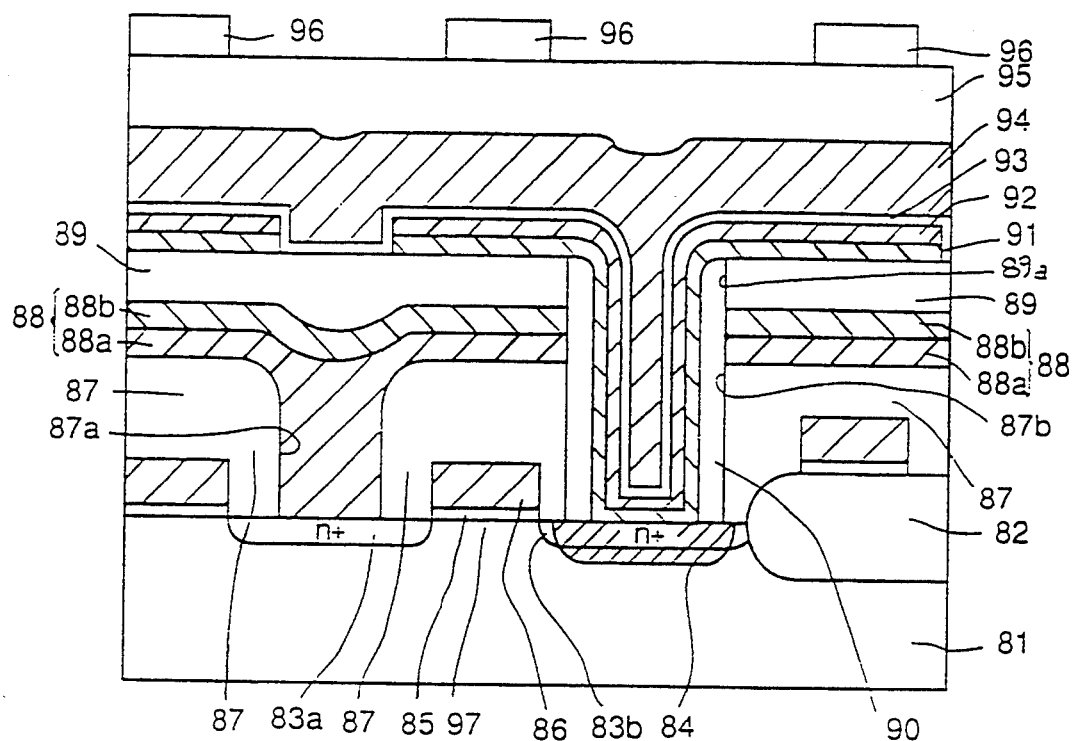
FIG. 35 is a sectional view showing a DRAM having a stacked-type capacitor according to a fifth embodiment of the present invention.

Referring to FIG. 35, in a DRAM according to a fifth embodiment, an isolation oxide film 82 for isolating elements is formed in a predetermined region on P type single crystalline silicon substrate 81. A pair of n+ impurity implantation layers 83a, 83b are formed to have channel region 97 interposed with a predetermined space therebetween in a region surrounded by isolation oxide film 82. A gate electrode 86 is formed on channel region 97 with gate oxide film 85 interposed. Interlayer insulating film 87 having contact holes 87a, 87b on n+ impurity implantation layers 83a, 83b, respectively, is formed to cover the whole surface. A polycrystalline silicon film 88a forming a bit line 88 is formed to electrically connect with n+ impurity implantation layer 83a in contact hole 87a and extend on interlayer insulating film 87. A silicide film 88b of WSi$_2$ and the like forming bit line 88 is formed on polycrystalline silicon film 88a. An interlayer insulating film 89 having a flattened surface and a contact hole 89a above n+ impurity implantation layer 83b is formed on silicide film 88b. A sidewall insulating film 90 is formed in a predetermined thickness on the surfaces of contact holes 87b, 89a. A high-resistance polycrystalline silicon film 91 including a small amount of impurities ($1 \times 10^{15}$/cm$^3$ before impurities are diffused from capacitor lower electrode 92) is electrically connected to n+ impurity implantation layer 83b in a region surrounded by sidewall insulating film 90. High-resistance polycrystalline silicon film 91 is formed to extend on the surface of interlayer insulating film 90 and the surface of interlayer insulating film 89. A capacitor lower electrode 92 of a low-resistance polycrystalline silicon film doped with an amount of impurities (phosphorus) larger than that of polycrystalline silicon film 91 is formed on polycrystalline silicon film 91. A capacitor dielectric film 93 is formed of a single layered film such as a thermal oxide film, a multi-layered film having a structure of, for example, a silicon oxide film/a silicon nitride film/a silicon oxide film, or Ta$_2$O$_5$ and the like on capacitor lower electrode 92. Capacitor upper electrode 94 of a low-resistance polycrystalline silicon film having an impurity concentration ($4-8 \times 10^{20}$/cm$^3$) almost the same as that of capacitor lower electrode 92 is formed on capacitor dielectric film 93. On capacitor upper electrode 94, interlayer insulating film 95 having a flattened surface is formed. Aluminum interconnections 96 are formed on interlayer insulating film 95 with predetermined spaces therebetween.

In the fifth embodiment, as in the second embodiment shown in FIG. 13, high-resistance polycrystalline silicon film 91 having an impurity concentration ($1 \times 10^{15}$/cm$^3$ before impurities are diffused from capacitor lower electrode 92) lower than that of capacitor lower electrode 92 is interposed between capacitor lower electrode 92 and n+ impurity implantation layer 83b, so that diffusion of the impurities from capacitor lower electrode 92 can be reduced in comparison with the conventional case. The end portion of n+ impurity diffusion layer 84 formed by the diffusion of the impurities on the side of gate electrode 86 is not extended from the end portion of n+ impurity implantation layer 83b on the side of gate electrode 86 and therefore the effective gate length is not shortened. As a result, as in the second embodiment, a short channel effect in which a threshold voltage is decreased and a punch through phenomenon can be effectively prevented. In the fifth embodiment, unlike in second embodiment shown in FIG. 13, bit line 88 is located under capacitor lower electrode 92.

Figure 36:
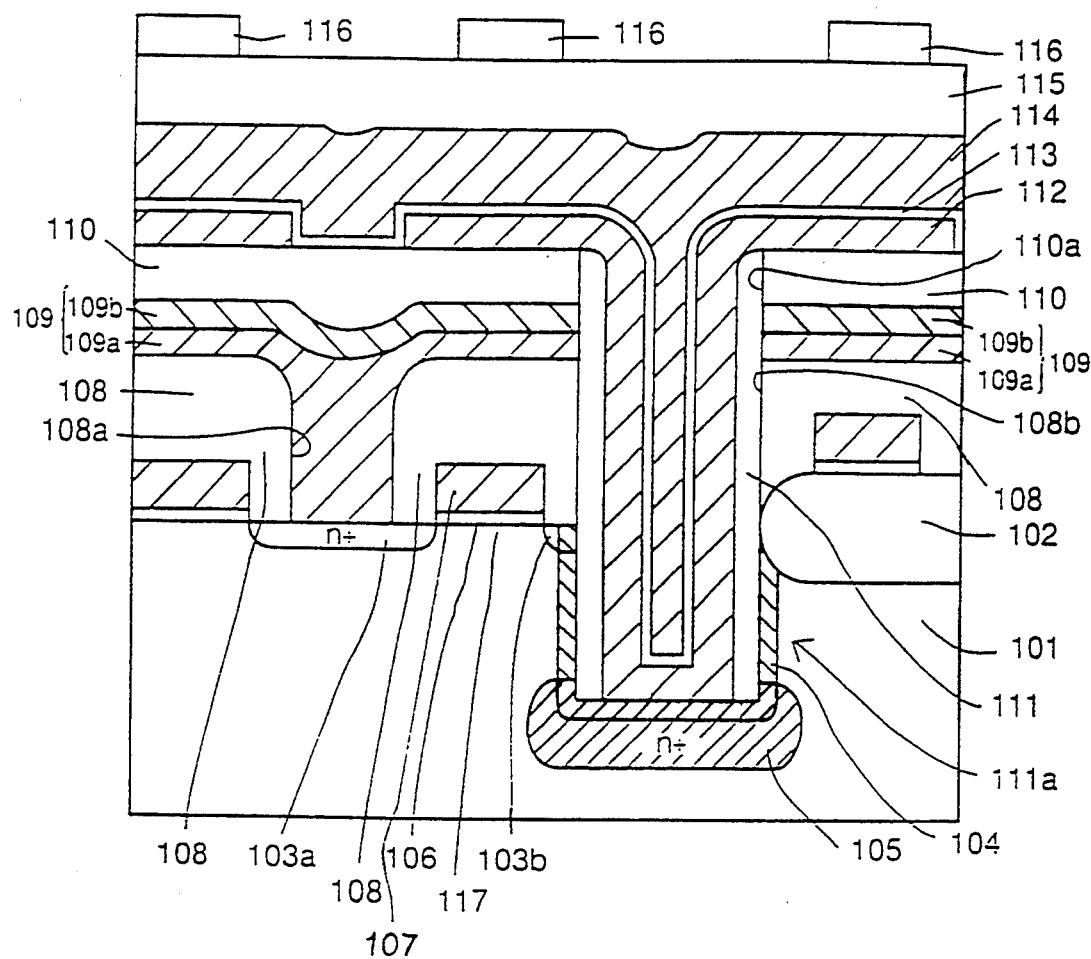
FIG. 36 is a sectional view showing a DRAM having a stacked-type capacitor according to the sixth embodiment of the present invention.

Referring to FIG. 36, in the sixth embodiment, an isolation oxide film 102 is formed in a predetermined region of p type single crystalline silicon substrate 101. A trench groove 101a is formed in a region of single crystalline silicon substrate 101 adjacent to isolation oxide film 102. n+ impurity implantation layer 103b is formed to have its end portion in contact with a side portion of trench groove 101a. n+ impurity implantation layer 103a is formed such that channel region 117 is interposed between n+ impurity implantation layers 103a and 103b. A gate electrode 107 is formed on channel region 117 with gate oxide film 106 interposed. n+ impurity implantation layer 104 is formed along a sidewall portion and a bottom surface of trench groove 101a. In the bottom portion of trench groove 101a, n+ impurity diffusion layer 105 is formed to overlap n+ impurity implantation layer 104. An interlayer insulating film 108 having openings 108a, 108b on n+ impurity implantation layer 103a and trench groove 101a, respectively, is formed to cover the whole surface. A polycrystalline silicon film 109a forming a bit line 109 is formed to electrically connect with n+ impurity implantation layer 103a in contact hole 108a and extend along interlayer insulating film 108. A silicide film 109b of WSi$_2$ and the like forming bit line 109 is formed on polycrystalline silicon film 109a. On silicide film 109b, an interlayer insulating film 110 having a flattened surface and a contact hole 110a above trench groove 101a is formed. A sidewall insulating film 111 is formed in a predetermined thickness on the sidewall portion of trench groove 101a and the surfaces of contact holes 108b and 110a. Capacitor lower electrode 112 is electrically connected to n+ impurity implantation layer 104 in the bottom portion of trench groove 101a within a region surrounded by sidewall insulating film 111. Capacitor lower electrode 112 is formed of a low-resistance polycrystalline silicon film doped with a large amount of impurities (phosphorus) ($4-8 \times 10^{20}$/cm$^3$).

A capacitor dielectric film 113 is formed of a single layered film such as a thermal oxide film, a multi-layered film having a structure of, for example, a silicon oxide film/a silicon nitride film/a silicon oxide film, or Ta$_2$O$_5$ and the like on capacitor lower electrode 112. A capacitor upper electrode 114 of a low-resistance polycrystalline silicon film having an impurity concentration ($4-8 \times 10^{20}$/cm$^3$) almost the same as that of the capacitor lower electrode is formed on capacitor dielectric film 113. An interlayer insulating film 115 whose surface is flattened is formed on capacitor lower electrode 114. Aluminum interconnections 116 are formed on interlayer insulating film 115 with predetermined spaces therebetween.

In the sixth embodiment, as in the third embodiment shown in FIG. 23, capacitor lower electrode 112 is in contact with n+ impurity implantation layer 104 only at the bottom portion of trench groove 101a. Thus, even though a diffusion area of n+ impurity diffusion layer 105 formed by thermal diffusion of impurities (phosphorus) in capacitor lower electrode 112 is widened, n+ impurity diffusion layer 105 will not overlap channel region 117 between n+ impurity implantation layers 103a and 103b. As a result, as in the third embodiment, the channel length is not shortened and a short channel effect and a punch through phenomenon can be effectively prevented. In this sixth embodiment, unlike the bit line in the third embodiment shown in FIG. 23, bit line 109 is located under capacitor lower electrode 112.

Figure 37:
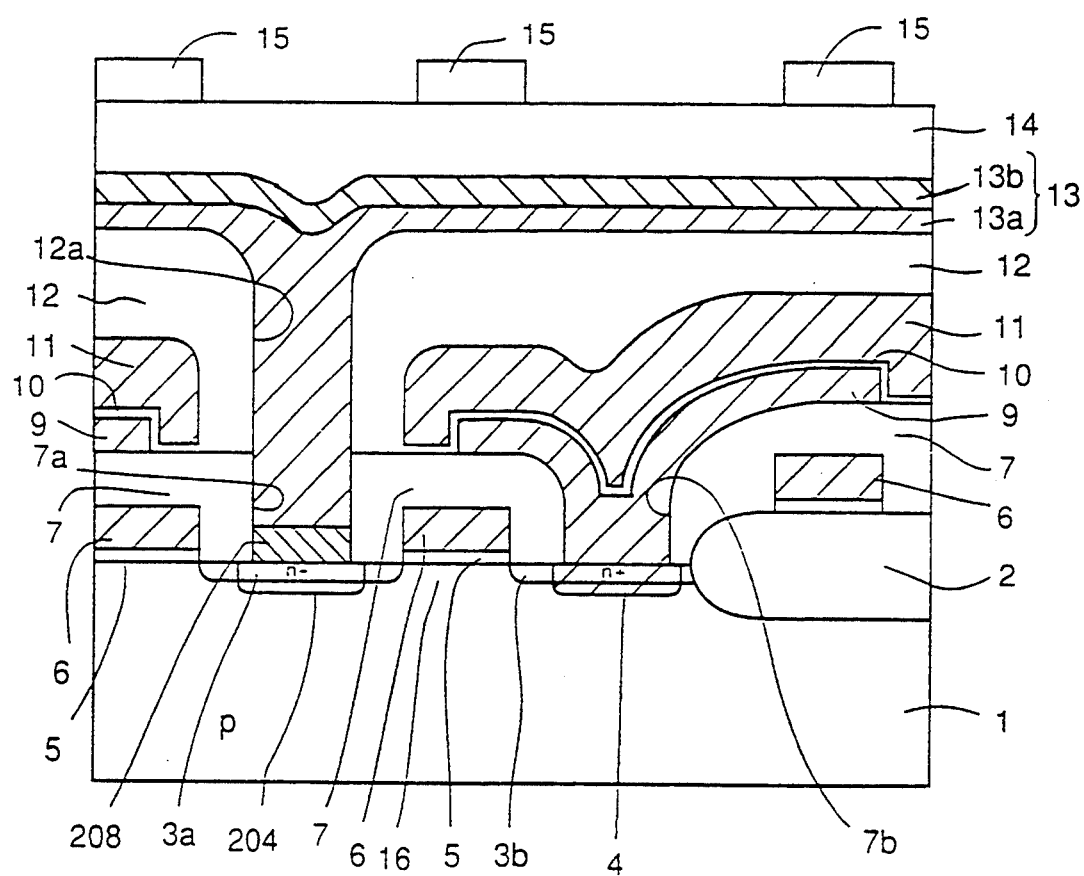
FIG. 37 is a sectional view showing a DRAM having a stacked-type capacitor according to the seventh embodiment of the present invention.
Figure 38:
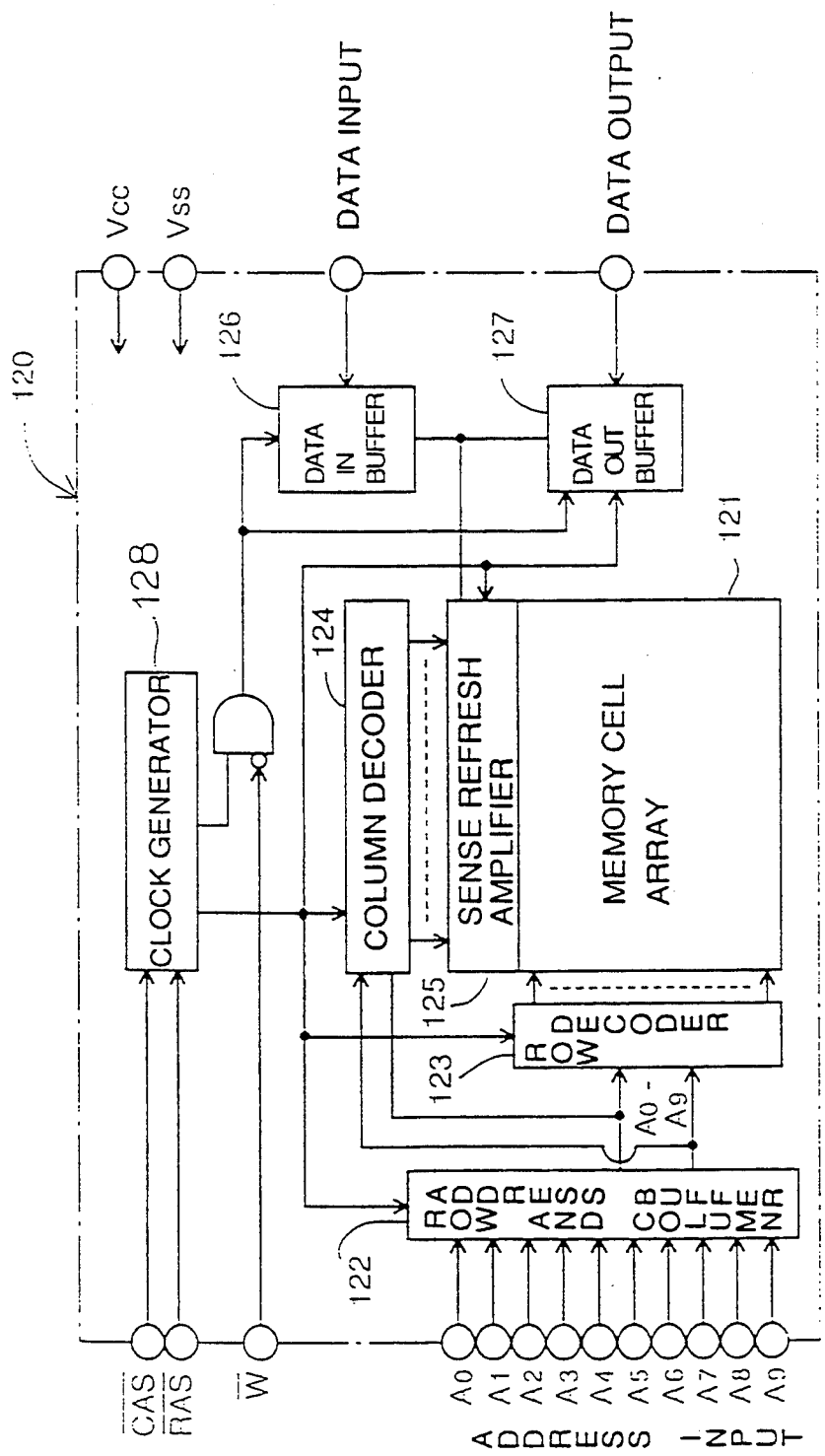
FIG. 38 is a block diagram showing a structure of a general DRAM.
Figure 39:
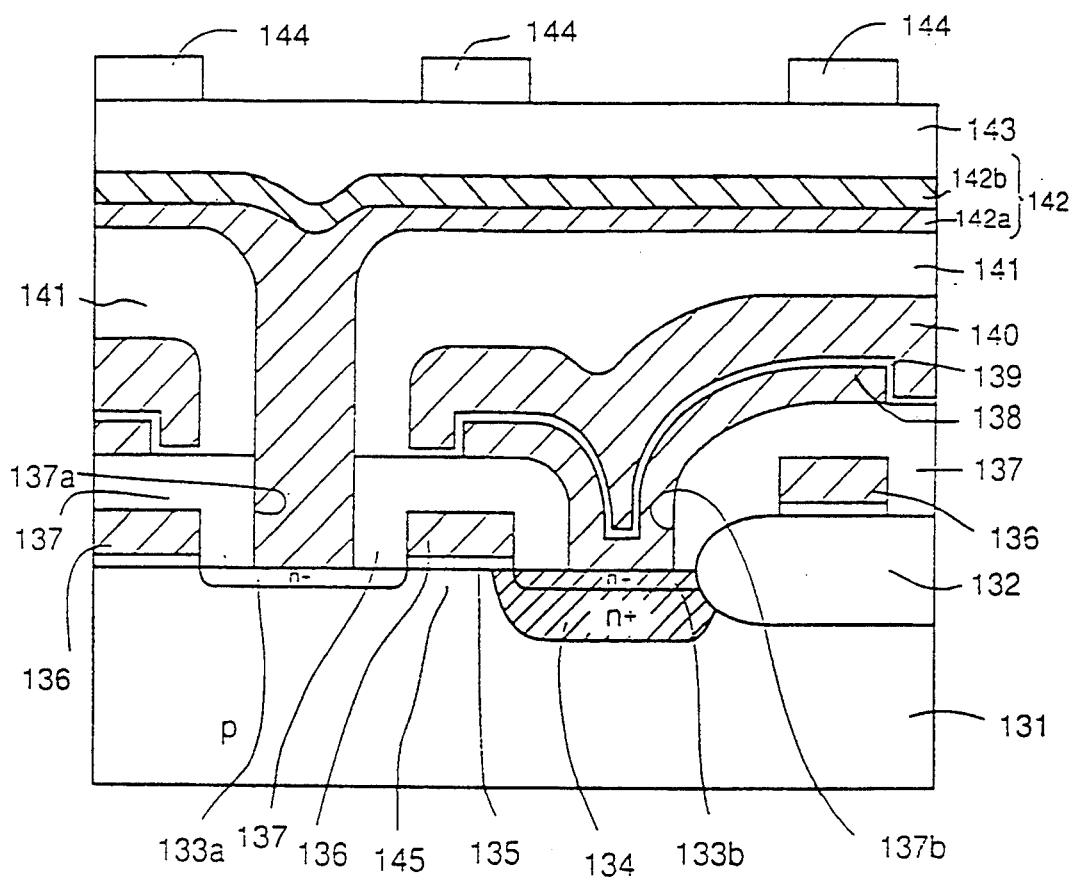
FIG. 39 is a sectional view showing a DRAM having a conventional stacked-type capacitor.
Figure 40:
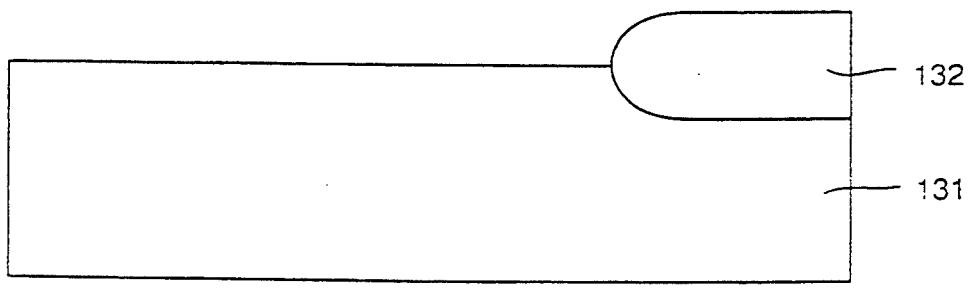
FIGS. 40 through 47 are sectional views showing respective steps of a manufacturing method of the conventional DRAM shown in FIG. 39.
Figure 41:
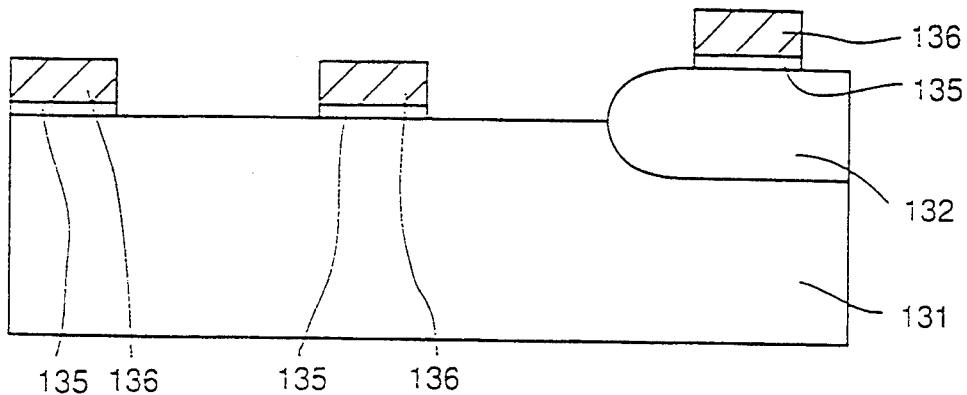
Figure 42:
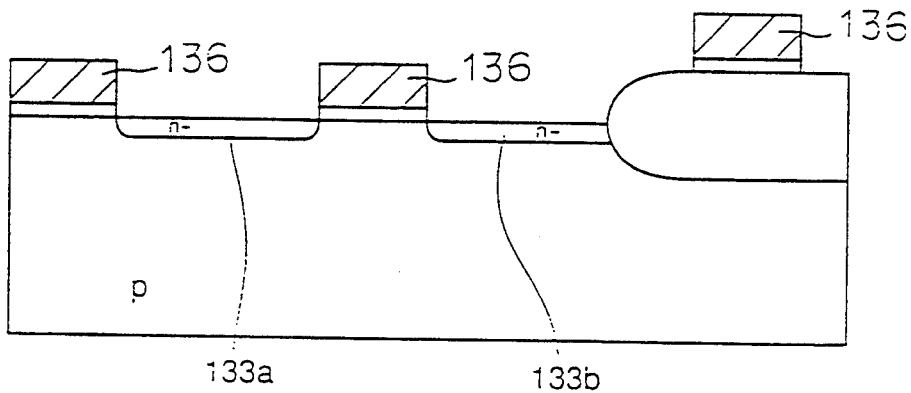
Figure 43:
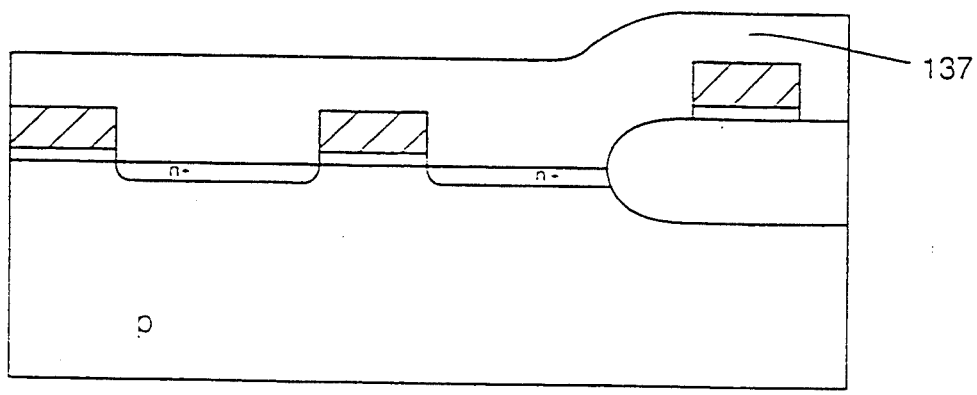
Figure 44:
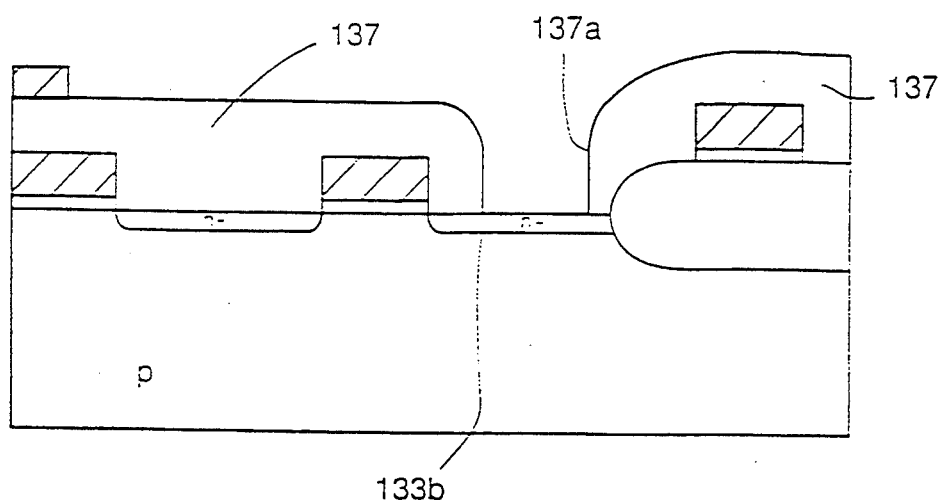
Figure 45:
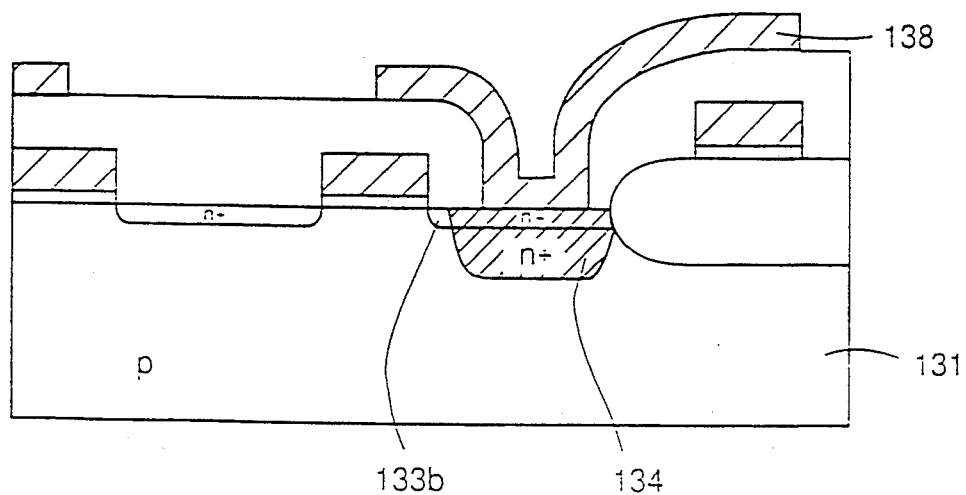
Figure 46:
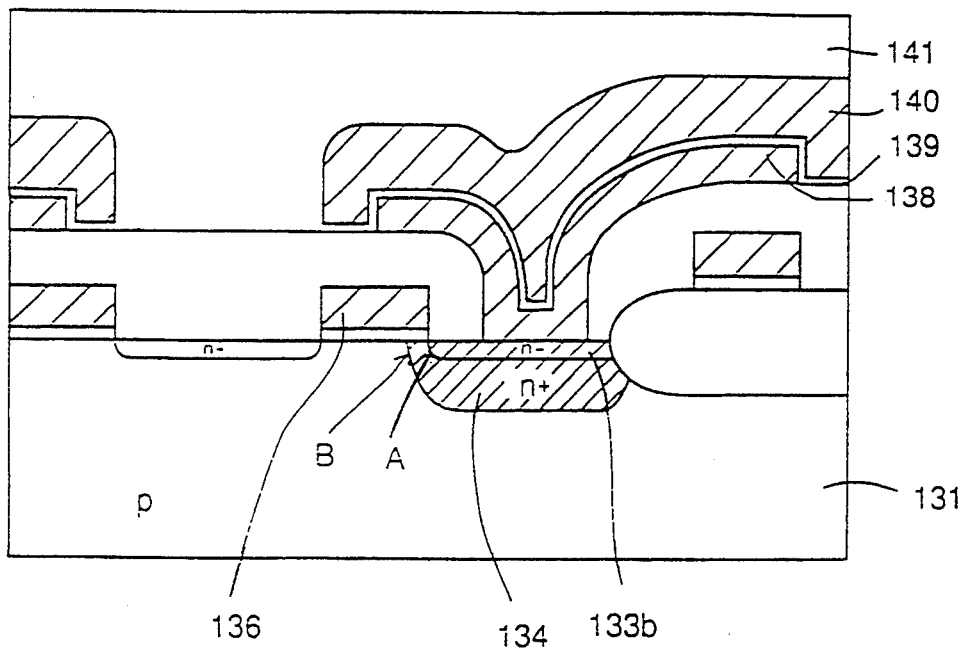
Figure 47:
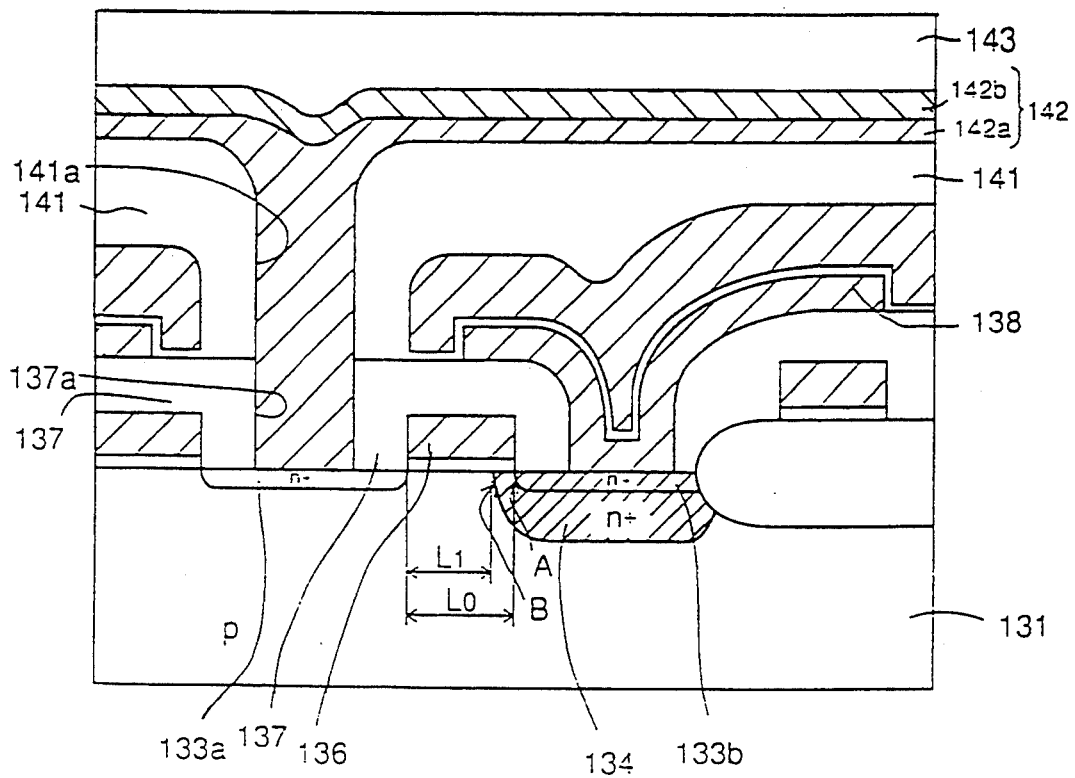
Figure 48:
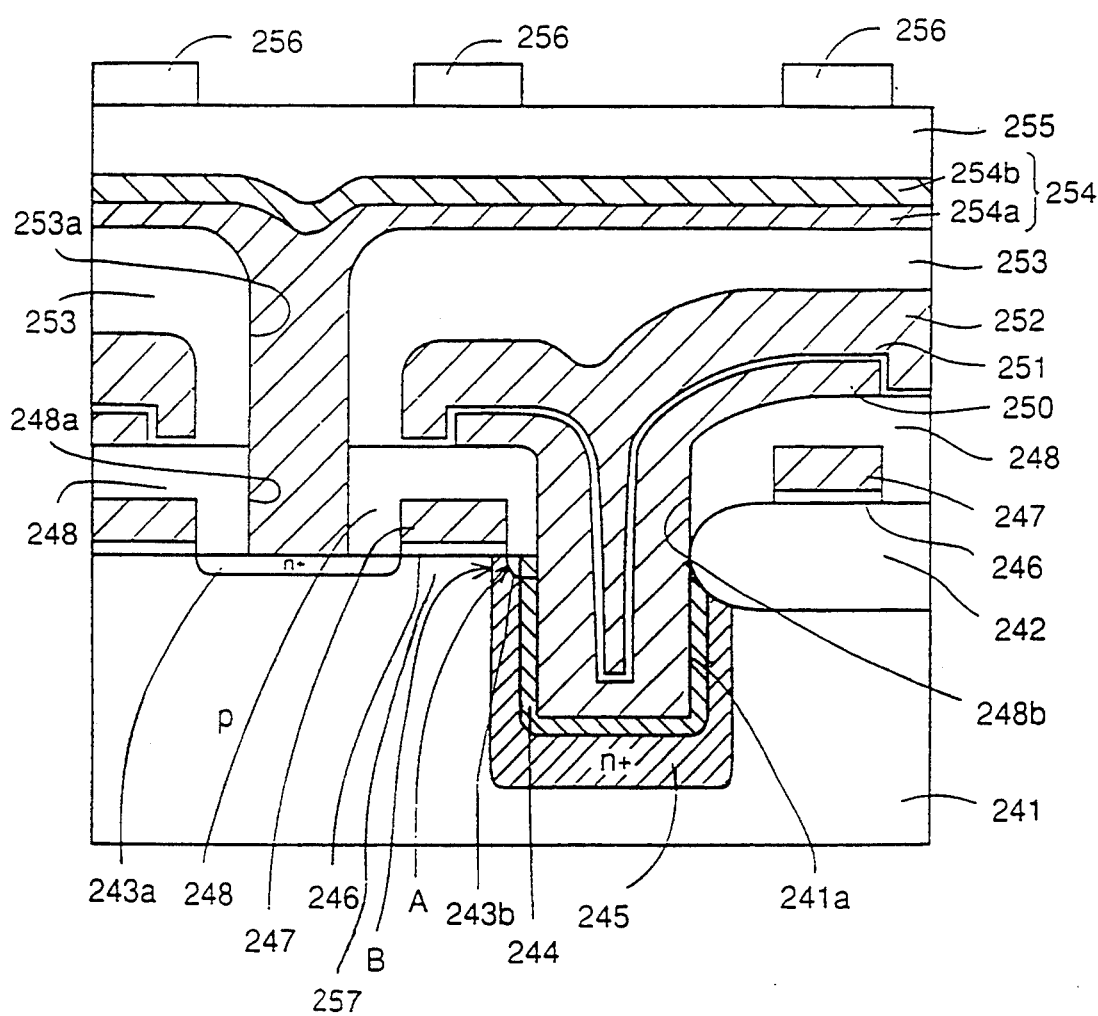
FIG. 48 is a sectional view showing a DRAM having another conventional stacked-type capacitor.

FIG. 37 is a sectional view showing structure of a DRAM having a stacked-type capacitor according to a seventh embodiment of the present invention. With reference to FIG. 37, in the seventh embodiment, an epitaxial silicon layer 208 is provided at a contact portion of a bit line 13 with respect to a single crystalline silicon substrate 1, not a contact portion of a capacitor lower electrode 9 in the structure of the DRAM of the first embodiment shown in FIG. 1. That is, with epitaxial silicon layer 208 interposed between a polycrystalline silicon film 13a constituting bit line 13 and an n+ impurity diffusion layer 204 formed by thermal diffusion from polycrystalline silicon film 13a, diffusion of impurities within polycrystalline silicon film 13a toward single crystalline silicon substrate 1 by a heat treatment is reduced. This results in a decrease in degree of diffusion of n+ impurity diffusion layer 204 even in a case, for example, where a heat treatment at about 850° C. is carried out for flattening of interlayer insulating films 14 and the like. This effectively prevents the end portion of n+ impurity diffusion layer 204 on the side of gate electrode 6 from extending from the end portion of n+ impurity implantation layer 3a on the side of gate electrode 6. This makes it possible to effectively prevent a short channel effect without shortening of the length of a channel region 16.

Accordingly, in a semiconductor device of the present invention, a first conductive layer having an impurity concentration lower than that of a second conductive layer is interposed between the second conductive layer and a first impurity region connected thereto, so that impurities in the second conductive layer are restrained from being diffused into a semiconductor substrate by thermal diffusion in comparison with the conventional case. Thus, even if heat treatment is carried out thereafter, diffusion of the impurities in the second conductive layer can be reduced in the heat treatment, and therefore an end portion of a third impurity region which is finally formed on the side of the gate electrode can be effectively prevented from being extended from an end portion of the first impurity region on the side of the gate electrode. As a result, an effective gate length is not shortened as it is in the conventional case, and also a short channel effect and a punch through phenomenon can be effectively prevented in which a threshold voltage is decreased. Also, even though there are variations in alignment of the gate electrode and the second conductive layer in patterning, the third impurity region does not extend from the end portion of the second impurity region on the side of the gate electrode, and variations in transistor characteristics can be also prevented effectively.

In another semiconductor device of the present invention, a second impurity region is formed along a sidewall and a bottom surface of a recessed portion formed in a predetermined region on a main surface of a semiconductor substrate, a sidewall insulating film is formed on the second impurity region on the sidewall of the recessed portion, and the second impurity region and the second conductive layer are electrically connected in the bottom part of the recessed portion. Thus, the third impurity region formed by thermal diffusion of impurities contained in the second conductive layer from the bottom part of the recessed portion is effectively prevented from overlapping a channel region between a first impurity region and the second impurity region. As a result, a channel length is not shortened, and a short channel effect and a punch through phenomenon can be effectively prevented.

According to another aspect of the present invention, a second impurity region is formed along the surface of a sidewall and a bottom of a recessed portion formed in a predetermined region on a main surface of a semiconductor substrate, a sidewall diffusion moderating film is formed on the second impurity region located on the sidewall of the recessed portion, and the second impurity region is electrically connected with a conductive layer at the bottom of the recessed portion. This effectively prevents a third impurity region which is formed by thermal diffusion of impurities in the conductive layer from the bottom of the recessed portion, from overlapping a channel region located between a first impurity region and the second impurity region. This results in an effective prevention of a short channel effect and punch through phenomenon without causing shortening of a channel length.

In a manufacturing method of a semiconductor device of the present invention, a first conductive layer is formed on a first impurity region to which a second conductive layer is connected, a second conductive layer having an impurity concentration higher than that of the first conductive layer is formed on the first conductive layer, and a third impurity region is formed by thermal diffusion of impurities contained in the second conductive layer. Thus, diffusion of the impurities in the second conductive layer can be reduced as compared with the conventional case, so that the impurities in the second conductive layer can be effectively restrained from further being diffused into a semiconductor substrate. As a result, an end portion of the third impurity region on the side of a gate electrode is not extended from an end portion of the first impurity region on the side of the gate electrode and therefore an effective gate length can be effectively prevented from being shortened.

In another manufacturing method of a semiconductor device of the present invention, a recessed portion is formed on a main surface of a semiconductor substrate with a predetermined space from a first impurity region, a second impurity region is formed along the main surface of the recessed portion, a sidewall insulating film is formed on the sidewall of the recessed portion, and a conductive layer is formed to electrically connect with the bottom portion of the recessed portion and extend along an interlayer insulating film. Thus, the conductive layer connects with the second impurity region only in the bottom part of the recessed portion, so that even if a diffusion area of the impurity region formed by thermal diffusion is widened by the subsequent heat treatment, the impurity region can be effectively prevented from overlapping the channel region. As a result, an effective gate channel is not shortened, and a short channel effect and a punch through phenomenon can be effectively prevented.

According to still another aspect of the present invention, a recessed portion is formed on a main surface of a semiconductor substrate with a predetermined space from a first impurity region, a second impurity region is formed along the main surface of the recessed portion, a sidewall diffusion moderating film is formed on a sidewall of the recessed portion, a conductive layer including a predetermined amount of impurities is formed to be electrically connected with a bottom of the recessed portion and extending along an interlayer insulating film, and a third impurity region is formed by thermal diffusion of impurities in the conductive layer. Accordingly, the connection of the conductive layer and the second impurity region is made only at the bottom of the recessed portion. Thus, even if a diffusion area of the third impurity region spreads by a succeeding heat treatment step, the third impurity region is effectively prevented from overlapping a channel region. This results in an effective prevention of a short channel effect and a punch through phenomenon without shortening of an effective gate length.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
   a semiconductor substrate of a first conductivity type having a main surface;
   first and second impurity regions of a second conductivity type formed spaced apart on the main surface of said semiconductor substrate on opposite sides of a channel region interposed therebetween;
   a gate electrode formed on said channel region with a gate insulating film interposed therebetween;
   a lower capacitor electrode comprising:
   a first conductive polycrystalline silicon layer including predetermined impurities connected to said first impurity region, said first conductive polycrystalline silicon layer having an upper surface, and
   a second conductive polycrystalline silicon layer including predetermined impurities formed only on said first conductive polycrystalline silicon layer; wherein
   an impurity concentration of said first conductive layer is lower than that of said second conductive layer,
   said upper surface of said first conductive polycrystalline silicon layer and a lower surface of said second polycrystalline silicon conductive layer are in contact with each other over their entire respective surfaces, and
   said lower capacitor electrode does not contain any conductive polycrystalline silicon having an impurity concentration greater than the impurity concentration of said first conductive polycrystalline silicon layer and extending beyond the lateral extent of said first conductive polycrystalline silicon layer.

2. The semiconductor device according to claim 1, wherein said first conductive layer includes an epitaxially grown silicon layer.

3. The semiconductor device according to claim 1, wherein
   a capacitor upper electrode is formed on said capacitor lower electrode with a capacitor insulating layer interposed;
   a bit line is connected to said second impurity region; and
   said bit line is formed to extend on said capacitor upper electrode with a first interlayer insulating layer interposed.

4. The semiconductor device according to claim 3, wherein a interconnection layer is formed on said bit line with a second interlayer insulating layer interposed.

5. The semiconductor device according to claim 1, wherein
   a capacitor upper electrode is formed on said capacitor lower electrode with a capacitor insulating film interposed;
   a bit line is connected to said second impurity region; and
   said bit line is formed to extend under said capacitor lower electrode with a first interlayer insulating layer interposed.

6. The semiconductor device according to claim 5, wherein an interconnection layer is formed on said capacitor upper electrode with a second interlayer insulating layer interposed.

7. A semiconductor device, comprising:
   a semiconductor substrate of a first conductivity type having a main surface and a recessed portion in a predetermined region of the main surface;
   a first impurity region of a second conductivity type formed in a predetermined region on the main surface of said semiconductor substrate;
   a second impurity region of the second conductivity type formed along an inside sidewall surface of the recessed portion of said semiconductor substrate to have a channel region interposed with a predetermined space from said first impurity region;
   a gate electrode formed on said channel region with a gate insulating film interposed;
   a sidewall insulating film formed on said second impurity region along the entirety of said inside sidewall surface of said recessed portion; and
   a conductive layer connected to said second impurity region at a bottom of said recessed portion, said sidewall insulating film being interposed between said second impurity region and said conductive layer.

8. The semiconductor device according to claim 7, wherein said conductive layer forms a capacitor lower electrode.

9. The semiconductor device according to claim 8, wherein
   a capacitor upper electrode is formed on said capacitor lower electrode with a capacitor insulating film interposed;
   a bit line is connected to said second impurity region; and
   said bit line is formed to extend on said capacitor upper electrode with a first interlayer insulating layer interposed.

10. The semiconductor device according to claim 9, wherein an interconnection layer is formed on said bit line with a second interlayer insulating layer interposed.

11. The semiconductor device according to claim 8, wherein
    a capacitor upper electrode is formed on said capacitor lower electrode with a capacitor insulating film interposed;
    a bit line is connected to said second impurity region; and
    said bit line is formed to extend under said capacitor lower electrode with a first interlayer insulating layer interposed.

12. The semiconductor device according to claim 11, wherein an interconnection layer is formed on said capacitor upper electrode with a second interlayer insulating layer interposed.

13. A semiconductor device, comprising:
    a semiconductor substrate of a first conductivity type having a main surface and a recessed portion in a predetermined region of the main surface;
    a first impurity of a second conductivity type formed in a predetermined region on the main surface of said semiconductor substrate;
    a second impurity region of the second conductivity type formed along an inside sidewall surface of the recessed portion of said semiconductor substrate to have a channel region interposed with a predetermined space from said first impurity region;
    a third impurity region of a second conductivity type formed to overlap said second impurity region in a bottom surface of the recessed portion of said semiconductor substrate;

a gate electrode formed on said channel region with a gate insulating film interposed;

a sidewall diffusion moderating film formed on said second impurity region along the entirety of said inside sidewall surface of said recessed portion; and a conductive layer including predetermined impurities connected to said second and third impurity regions at a bottom of said recessed portion, said sidewall diffusion moderating film being interposed between said second impurity region and said conductive layer.

14. The semiconductor device according to claim 13, wherein said conductive layer forms a capacitor lower electrode.

15. A semiconductor device, comprising:

a semiconductor substrate of a first conductivity type having a main surface;

first and second impurity regions of a second conductivity type formed to have a channel region interposed with a predetermined space on said main surface of the semiconductor substrate;

a gate electrode formed on said channel region with a gate insulating film interposed therebetween;

a first insulating layer formed to cover said gate electrode and having first and second openings on said first and second impurity regions, respectively;

a conductive layer including impurities and electrically connected to said first impurity region within said first opening;

a capacitor formed of a capacitor lower electrode including impurities and extending along said first insulating layer on said conductive layer and a capacitor upper electrode formed thereon with a capacitor insulating film interposed therebetween, said lower capacitor electrode comprising:

a first conductive polycrystalline silicon layer including predetermined impurities connected to said first impurity region, said first conductive polycrystalline silicon layer having an upper surface, and a second conductive polycrystalline silicon layer including predetermined impurities formed only on said first conductive polycrystalline silicon layer;

a second insulating layer formed to cover said capacitor upper electrode and have a third opening on said second opening;

a bit line formed to be electrically connected to said second impurity region within said second and third openings and extend along said second insulating layer;

a third insulating layer formed on said bit line; and an interconnection layer formed on said third insulating layer; wherein an impurity concentration of said first conductive layer is lower than that of said second conductive layer, said upper surface of said first conductive polycrystalline silicon layer and a lower surface of said second polycrystalline silicon conductive layer are in contact with each other over their entire respective surfaces, and said lower capacitor electrode does not contain any conductive polycrystalline silicon having an impurity concentration greater than the impurity concentration of said first conductive polycrystalline silicon layer and extending beyond the lateral extent of said first conductive polycrystalline silicon layer.

16. A semiconductor device, comprising:

a semiconductor substrate of a first conductivity type having a main surface and a recessed portion in a predetermined region on the main surface;

a first impurity region of a second conductivity type formed in a predetermined region on the main surface of said semiconductor substrate;

a second impurity region of the second conductivity type formed along an inside sidewall surface of said recessed portion of the semiconductor substrate to have a channel region interposed with a predetermined space from said first impurity region;

a third impurity region of a second conductivity type formed to overlap said second impurity region in a bottom surface of said recessed portion of the semiconductor substrate;

a gate electrode formed on said channel region with a gate insulating film interposed;

a first insulating layer formed to cover said gate electrode and to have first opening and second opening on said first impurity region and said recessed portion, respectively;

a sidewall insulating film formed on said second impurity region along the entirety of said inside sidewall surface of said recessed portion and on a surface of said second opening;

a capacitor formed of a capacitor lower electrode formed to be connected to said second and third impurity regions in a bottom portion of said recessed portion and to extend along the sidewall insulating film and said first insulating layer, and a capacitor upper electrode formed thereon with a capacitor insulating film interposed, said sidewall insulating film being interposed between said second impurity region and said lower electrode;

a second insulating layer formed to cover said capacitor upper electrode and having a third opening on said first opening;

a bit line formed to be electrically connected to said second impurity region within said first opening and third opening and to extend along said second insulating layer;

a third insulating layer formed on said bit line; and an interconnection layer formed on said third insulating layer.

17. A semiconductor device comprising:

a semiconductor substrate of a first conductivity type having a main surface;

first and second impurity regions of a second conductivity type formed to have a channel region interposed with a predetermined space therebetween on said main surface of the semiconductor substrate;

a gate electrode formed on said channel region with a gate insulating film interposed therebetween;

a first insulating layer formed to cover said gate electrode and having first and second openings on said first and second impurity regions, respectively;

a bit line formed to be electrically connected to said second impurity region within said second opening and to extend along said first insulating layer;

a second insulating layer formed on said bit line and having a third opening on said first opening;

a sidewall insulating film formed in a predetermined thickness on surfaces of said first opening and third opening;

a conductive layer including impurities and connected to said first impurity region within a region surrounded by said sidewall insulating film;

a capacitor formed of a capacitor lower electrode formed to extend along said sidewall insulating film and said second insulating layer on said conductive layer and a capacitor upper electrode formed thereon with a capacitor insulating layer interposed therebetween, said lower capacitor electrode comprising:
   a first conductive polycrystalline silicon layer including predetermined impurities connected to said first impurity region, said first conductive polycrystalline silicon layer having an upper surface, and
   a second conductive polycrystalline silicon layer including predetermined impurities formed only on said first conductive polycrystalline silicon layer;

a third insulating layer formed on said third insulating layer; wherein
   an impurity concentration of said first conductive layer is lower than that of said second conductive layer,
   said upper surface of said first conductive polycrystalline silicon layer and a lower surface of said second polycrystalline silicon conductive layer are in contact with each other over their entire respective surfaces, and said lower capacitor electrode does not contain any conductive polycrystalline silicon having an impurity concentration greater than the impurity concentration of said first conductive polycrystalline silicon layer and extending beyond the lateral extent of said first conductive polycrystalline silicon layer.

18. A semiconductor device, comprising:

a semiconductor substrate of a first conductivity type having a main surface and a recessed portion in a predetermined region on the main surface;

a first impurity region of a second conductivity type formed in a predetermined region on said main surface of the semiconductor substrate;

a second impurity region of a second conductivity type formed along an inside surface of said recessed portion of the semiconductor substrate to have a channel region interposed with a predetermined space from said first impurity region;

a third impurity region of the second conductivity type formed to overlap said second impurity region in a bottom surface of said recessed portion of the semiconductor substrate;

a gate electrode formed on said channel region with a gate insulating film interposed;

a first insulating layer formed to cover said gate electrode and having a first opening and a second opening in said first impurity region and said recessed portion, respectively;

a bit line formed to be electrically connected to said first impurity region within said first opening and to extend along said first insulating layer;

a second insulating layer formed on said bit line and having a third opening on said second opening;

a sidewall insulating film formed in a predetermined thickness on surfaces of said recessed portion, said second opening and said third opening;

a capacitor formed of a capacitor lower electrode formed to be connected to first and third impurity regions in a bottom portion of said recessed portion within a region surrounded by said sidewall insulating film and to extend along said sidewall insulating film and said second insulating layer and a capacitor upper electrode formed thereon with a capacitor insulating film interposed, said sidewall insulating layer being formed along said inside surface of said recessed portion to be interposed between said second impurity region and said capacitor lower electrode;

a third insulating layer formed to cover said capacitor upper electrode; and an interconnection layer formed on said third insulating layer.

19. A semiconductor device, comprising:

a semiconductor substrate of a first conductivity type having a main surface;

first and second impurity regions of a second conductivity type formed spaced apart on the main surface of said semiconductor substrate on opposite sides of a channel region interposed therebetween;

a gate electrode formed on said channel region with a gate insulating film interposed therebetween;

a lower capacitor electrode comprising:
   a first conductive polycrystalline silicon layer including predetermined impurities connected to said first impurity regions, said conductive polycrystalline silicon layer having an upper surface, and
   a second conductive polycrystalline silicon layer including predetermined impurities, formed only on, in contact with, and covering the upper surface of said first conductive polycrystalline silicon layer; wherein
      an impurity concentration of said first conductive polycrystalline silicon layer is lower than that of said second conductive polycrystalline silicon layer, and said lower capacitor electrode does not contain any conductive polycrystalline silicon having an impurity concentration greater than the impurity concentration of said first conductive polycrystalline silicon layer and extending beyond the lateral extent of said first conductive polycrystalline silicon layer.

* * * * *